US008847390B2

(12) United States Patent
Hashino et al.

(10) Patent No.: US 8,847,390 B2
(45) Date of Patent: Sep. 30, 2014

(54) LEAD-FREE SOLDER BUMP BONDING STRUCTURE

(71) Applicants: Eiji Hashino, Tokyo (JP); Shinji Ishikawa, Tokyo (JP); Shinichi Terashima, Tokyo (JP); Masamoto Tanaka, Tokyo (JP)

(72) Inventors: Eiji Hashino, Tokyo (JP); Shinji Ishikawa, Tokyo (JP); Shinichi Terashima, Tokyo (JP); Masamoto Tanaka, Tokyo (JP)

(73) Assignee: Nippon Steel & Sumikin Materials Co., Ltd., Tokyo (JP)

( * ) Notice: Subject to any disclaimer, the term of this patent is extended or adjusted under 35 U.S.C. 154(b) by 0 days.

(21) Appl. No.: 13/951,596

(22) Filed: Jul. 26, 2013

(65) Prior Publication Data
US 2014/0054766 A1 Feb. 27, 2014

(30) Foreign Application Priority Data
Jul. 27, 2012 (JP) ................................. 2012-166640

(51) Int. Cl.
H01L 23/48 (2006.01)
H01L 23/52 (2006.01)
H01L 29/40 (2006.01)
H01L 23/498 (2006.01)

(52) U.S. Cl.
CPC .... H01L 23/49866 (2013.01); H01L 23/49811 (2013.01)
USPC ........... 257/737; 257/762; 257/772; 257/779; 257/780

(58) Field of Classification Search
CPC .............. H01L 23/49811; H01L 23/49866; H01L 2924/01327; H01L 2224/0401
USPC ........................ 257/737, 762, 772, 779, 780
See application file for complete search history.

(56) References Cited

U.S. PATENT DOCUMENTS

| 6,583,514 B2 * | 6/2003 | Tago et al. ..................... 257/778 |
| 6,744,142 B2 * | 6/2004 | Liu et al. ........................ 257/778 |
| 8,378,485 B2 * | 2/2013 | Bachman et al. ............. 257/737 |
| 2010/0015796 A1 * | 1/2010 | Tago et al. ..................... 438/614 |

FOREIGN PATENT DOCUMENTS

JP 05-50286 3/1993

* cited by examiner

Primary Examiner — Thien F Tran
(74) Attorney, Agent, or Firm — Kenyon & Kenyon LLP

(57) ABSTRACT

According to a lead-free solder bump bonding structure, by causing the interface (IMC interface) of the intermetallic compound layer at a lead-free-solder-bump side to have scallop shapes of equal to or less than 0.02 [portions/μm] without forming in advance an Ni layer as a barrier layer on the surfaces of respective Cu electrodes of first and second electronic components like conventional technologies, a Cu diffusion can be inhibited, thereby inhibiting an occurrence of an electromigration. Hence, the burden at the time of manufacturing can be reduced by what corresponds to an omission of the formation process of the Ni layer as a barrier layer on the Cu electrode surfaces, and thus a lead-free solder bump bonding structure can be provided which reduces a burden at the time of manufacturing in comparison with conventional technologies and which can inhibit an occurrence of an electromigration.

5 Claims, 17 Drawing Sheets

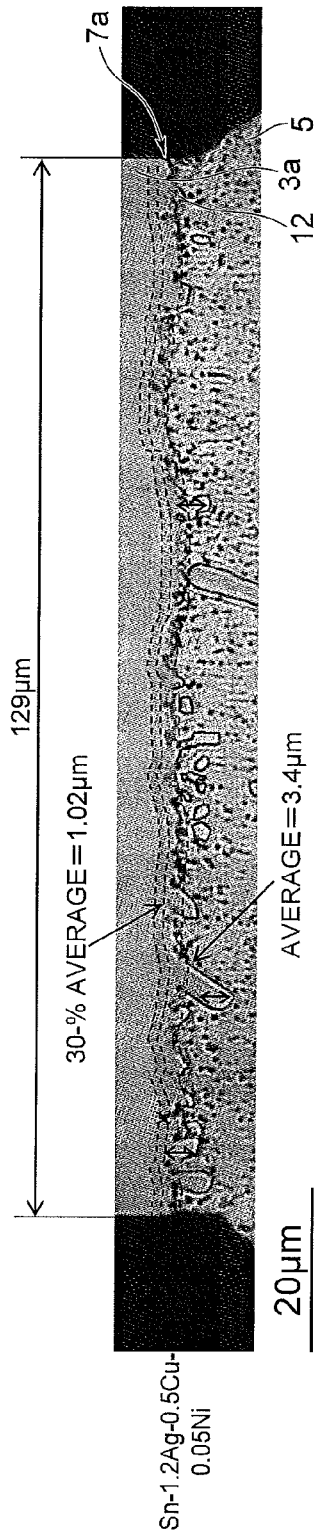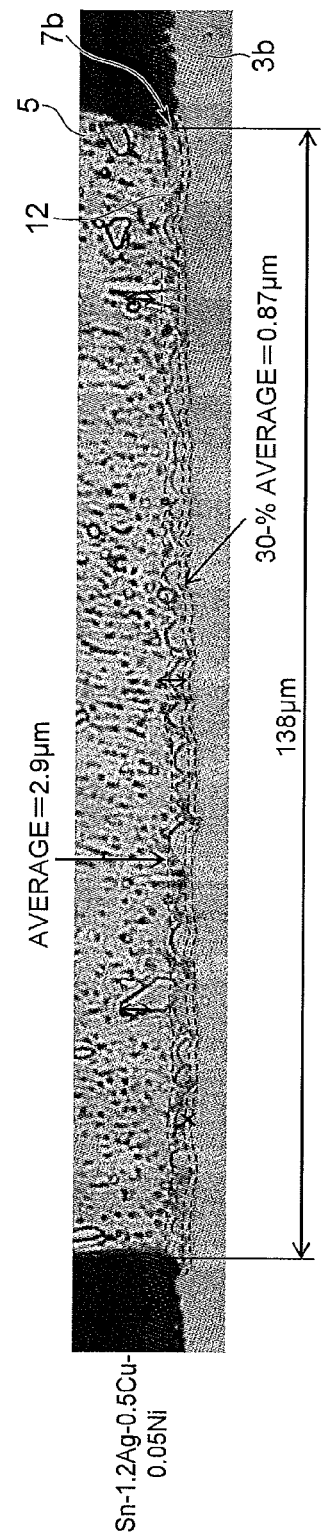
FIG. 2A
FIG. 2B

LEAD-FREE SOLDER BUMP BONDING STRUCTURE

CROSS-REFERENCE TO RELATED APPLICATION

This application claims priority to Japanese Application No. 2012-166640, filed Jul. 27, 2012, the content of which is incorporated by reference in its entirety.

BACKGROUND OF THE INVENTION

1. Field of the Invention

The present invention relates to a lead-free solder bump bonding structure, and is suitable when applied to a lead-free solder bump bonding structure that has, for example, a copper electrode (hereinafter, referred to as a Cu electrode) of a first electronic component and a Cu electrode of a second electronic component bonded by a lead-free solder bump.

2. Description of the Related Art

An example known technique of electrically connecting electronic components of an electronic device, etc., is to utilize a protrusion formed on an electrode and called a bump. In recent years, in view of environmental problems and the RoHS instruction (Restriction of the Use of Certain Hazardous Substances in Electrical and Electronic Equipment) by EU, etc., bumps formed on Cu electrodes employ a lead-free solder alloy containing no Pb (see, for example, JP H05-50286 A).

Moreover, in accordance with the downsizing of electronic devices and the advancement of the high functionality thereof in recent years, high-density packaging is necessary in the field of semiconductor packaging. Hence, the flip-chip packaging technology advantageous for high-density packaging is becoming popular rapidly, and nowadays, a narrow pitch such that the electrode pitch is equal to or smaller than 200 [μm] is often required. According to such a narrow pitching, it is necessary to further miniaturize the bumps, while at the same time, the amount of current increases due to the advancement of the high functionality of chips in recent years.

In the bonded part of electronic components by a lead-free solder alloy (hereinafter, sometimes simply referred to as a lead-free solder bonded part), however, when a flowing current per a unit area (current density) increases, an electromigration of Cu at the lead-free solder bonded part (hereinafter, electromigration means the electromigration of Cu) occurs, resulting in a disconnection failure in some cases. Hence, in recent years, a lead-free solder bump bonding structure is proposed which has an Ni layer formed in advance on the Cu electrode of the lead-free solder bonded part, and causes Ni layer to function as a barrier layer in order to inhibit a Cu diffusion from the Cu electrode, thereby inhibiting an occurrence of an electromigration phenomenon even if the current density becomes high.

According to such a lead-free solder bump bonding structure employing the above-explained structure, however, in order to inhibit an occurrence of an electromigration, it is necessary to form the Ni layer as a barrier layer in advance on the Cu electrode surface prior to place a lead-free solder ball on the Cu electrode of a first electronic component, and to also form the Ni layer in advance on the Cu electrode of a second electronic component. Hence, the manufacturing process of the lead-free solder bump bonding structure becomes complex by what corresponds to the necessity of the Ni layer forming process, and thus the increase of the burden like the cost increase at the time of manufacturing is a technical disadvantage.

The present invention has been made in view of the above-explained circumstances, and it is an object of the present invention to provide a lead-free solder bump bonding structure which reduces a burden at the time of manufacturing in comparison with conventional technologies, and which can inhibit an occurrence of an electromigration phenomenon.

SUMMARY OF THE INVENTION

To accomplish the above object, a first aspect of the present invention provides a lead-free solder bump bonding structure that includes: a lead-free solder bump that bonds a Cu electrode of a first electronic component and a Cu electrode of a second electronic component, a large current with a current density of equal to or greater than $0.7 \times 10^3$ [A/cm$^2$] flowing between the first electronic component and the second electronic component through the lead-free solder bump. The lead-free solder bump includes an alloy containing Sn as a primary component and inevitable impurities, and forms intermetallic compound layers in a boundary with the Cu electrode of the first electronic component and in a boundary with the Cu electrode of the second electronic component, and the intermetallic compound layer has scallop (concavo-convex) shapes with a difference in height that is equal to or greater than 4 [μm] between a bottom portion of a layer thickness portion which is equal to or smaller than 30% of an average thickness of the intermetallic compound layer, and a peak portion adjacent to the bottom portion, at an interface with the lead-free solder bump, the number of scallop shapes in the intermetallic compound layer is equal to or less than 0.02 [portions/μm].

The lead-free solder bump may contain at least one kind of followings: Ni; Co; and Fe at a total of 0.005 to 0.2 mass %.

The lead-free solder bump may contain Ag of 0 to 5 mass % and Cu of 0 to 2 mass %.

The lead-free solder bump may further contain at least one kind of followings: P; Mg; and Ge at a total of 0 to 0.01 mass %.

The lead-free solder bump may contain at least one kind of followings: Pd; Mn, Zn; Al; Sb; and In, and, Pd, Mn, and Al being 0 to 1 mass %, Zn being 0 to 10 mass %, Sb being 0 to 3 mass %, and In 0 to 7 mass %.

According to a lead-free solder bump bonding structure of the present invention, by causing the interface (IMC interface) of the intermetallic compound layer at a lead-free-solder-bump side to have scallop shapes of equal to or less than 0.02 [portions/μm] without forming in advance an Ni layer as a barrier layer on the surfaces of respective Cu electrodes of first and second electronic components like conventional technologies, a Cu diffusion can be inhibited, thereby inhibiting an occurrence of an electromigration. Hence, the burden at the time of manufacturing can be reduced by what corresponds to an omission of the formation process of the Ni layer as a barrier layer on the Cu electrode surfaces, and thus a lead-free solder bump bonding structure can be provided which reduces a burden at the time of manufacturing in comparison with conventional technologies and which can inhibit an occurrence of an electromigration.

BRIEF DESCRIPTION OF THE DRAWINGS

FIG. 2A is an optical microscope photograph illustrating a boundary portion between a lead-free solder bump and a Cu electrode in the lead-free solder bump bonding structure in FIG. 1 in an enlarged manner;

FIG. 2B is an optical microscope photograph illustrating a boundary portion between a lead-free solder bump and a Cu electrode in the lead-free solder bump bonding structure in FIG. 1 in an enlarged manner;

DETAILED DESCRIPTION OF THE PREFERRED EMBODIMENTS

Figure 1:
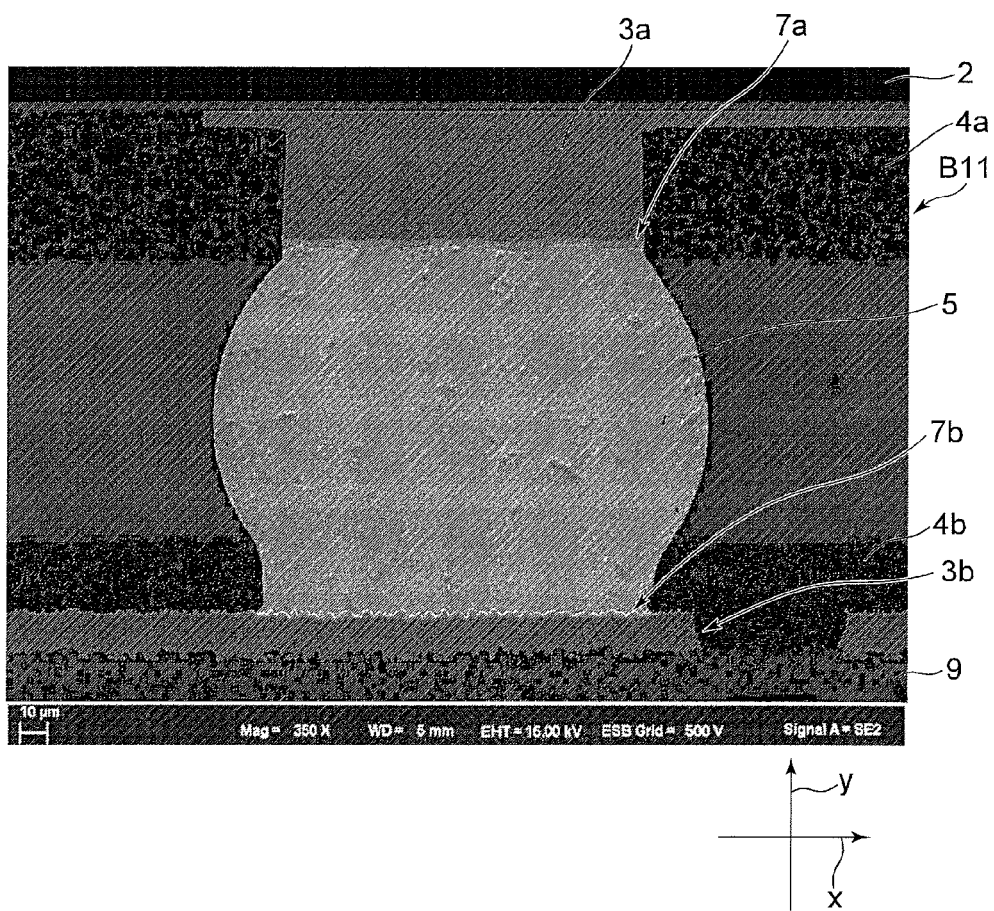
FIG. 1 is an SEM photograph illustrating a side cross-sectional structure of a lead-free solder bump bonding structure according to an embodiment of the present invention.

FIG. 1 is an SEM (Scanning Electron Microscope) photograph of a lead-free solder bump bonding structure B11 according to an embodiment of the present invention. A lead-free solder bump 5 formed of a lead-free solder alloy is formed between a Cu electrode 3a of a first electronic component 2 and a Cu electrode 3b of a second electronic component 9, and the Cu electrodes 3a and 3b facing with each other are physically and electrically bonded together via the lead-free solder bump 5. In FIG. 1, reference numerals 4a and 4b denote insulating layers, and the Cu electrodes 3a and 3b are surrounded by the respective insulating layers 4a and 4b.

The lead-free solder bump bonding structure B11 of this embodiment differs from conventional lead-free solder bump bonding structures that no Ni layer as a barrier layer is formed on the surfaces of the Cu electrodes 3a and 3b, but intermetallic compound (IMC) layers 7a and 7b are formed in respective boundaries between the lead-free solder bump 5 and the Cu electrodes 3a and 3b by reflow performed through a manufacturing process. This intermetallic compound layer serves as a barrier layer.

In addition, the intermetallic compound layers 7a and 7b formed on the lead-free solder bump bonding structure B11 have improved anti-electromigration characteristics between the Cu electrodes 3a, 3b and the lead-free solder bump 5 since the interface with the lead-free solder bump 5 is flattened, thereby inhibiting a disconnection failure due to the electromigration of Cu.

In particular, the lead-free solder bump bonding structure B11 of this embodiment is applied to an electric circuit using a large current having a current density of equal to or greater than $0.7 \times 10^3$ [A/cm$^2$], preferably, a larger current having a current density of equal to or greater than $1.0 \times 10^3$ [A/cm$^2$], and can inhibit an occurrence of an electromigration even if such a large current is caused to flow between the first electronic component 2 and the second electronic component 9 through the lead-free solder bump 5.

Moreover, according to the lead-free solder bump bonding structure B11, when, for example, the lead-free solder bump 5 is formed using a lead-free solder ball formed of a lead-free solder alloy in a ball shape, a lead-free solder ball having a diameter of substantially 10 to 300 [μm] is used to accomplish the miniaturization of the lead-free solder bump 5. Accordingly, even if the current density becomes high between the first electronic component 2 and the second electronic component 9 through the lead-free solder bump 5, it becomes possible to keep a large current flowing between the first electronic component 2 and the second electronic component 9 without causing a disconnection failure.

The intermetallic compound layers 7a and 7b on the surfaces of the Cu electrodes 3a and 3b are formed when a lead-free solder alloy is subjected to reflow on the surfaces of the Cu electrodes 3a and 3b in the manufacturing process, and the lead-free solder bump 5 is formed. According to this embodiment, the interface shape of the intermetallic compound layers 7a and 7b with the lead-free solder bump 5 formed by reflow is important, and such an interface shape is flattened and has a substantially uniform layer thickness. This prevents Cu of the Cu electrodes 3a and 3b from being diffused in the lead-free solder bump 5, thereby inhibiting an occurrence of an electromigration.

FIGS. 2A and 2B are optical microscope photographs illustrating a boundary portion between the lead-free solder bump 5 and the Cu electrodes 3a and 3b in the lead-free solder bump bonding structure B11 illustrated in FIG. 1. As illustrated in FIGS. 2A and 2B, the intermetallic compound layers 7a and 7b have an importance that, in an interface 12 with the lead-free solder bump 5 (hereinafter, referred to as an IMC interface), the number of scallop (concavo-convex) shapes where a difference in height between a bottom portion of the layer thickness portion of the intermetallic compound layers 7a and 7b which is equal to or smaller than 30% of an average thickness and a peak portion thereof adjacent to such a bottom portion is equal to or larger than 4 [μm] is equal to or less than 0.02 [portions/μm], preferably, equal to or less than 0.01 [portion/μm]. The intermetallic compound layers 7a and 7b can be regarded that the IMC interface 12 is flattened when the number of scallop shapes formed in such an IMC interface 12 and having a large difference in height that is equal to or greater than 4 [μm] is equal to or less than 0.02 [portions/μm], and such a flattened interface shape inhibits a Cu diffusion of the Cu electrodes 3a and 3b.

When the number of scallop shapes is equal to or less than 0.01 [portion/μm], the IMC interface 12 of the intermetallic compound layers 7a and 7b is further flattened, and thus the Cu diffusion of the Cu electrodes 3a and 3b can be further inhibited, and the anti-electromigration characteristic is further improved. Conversely, when the number of scallop shapes exceeds 0.02 [portions/μm], the IMC interface 12 of the intermetallic compound layers 7a and 7b becomes rough.

Accordingly, the difference in height between the bottom portion and the peak portion and the width of the bottom portion increase. Hence, Cu of the Cu electrodes 3a and 3b becomes likely to diffuse from the bottom portion deeply concaved in the IMC interface 12 to the interior of the lead-free solder bump 5, resulting in a deterioration of the improving effect of the anti-electromigration characteristic.

According to this embodiment, for example, a side cross-sectional shape across the whole width from one end to another end of the intermetallic compound layers 7a and 7b is observed viewing sideways to check how many scallop shapes are present which have a difference in height that is equal to or larger than 4 [μm] between the bottom portion of the layer thickness portion which is equal to or smaller than 30% of the average thickness of the intermetallic compound layers 7a and 7b and the peak portion adjacent thereto across the whole width direction of the IMC interface 12 running in a width direction x (a direction orthogonal to a direction y interconnecting the Cu electrodes 3a and 3b facing with each other, see FIG. 1) at the side cross-sectional location.

When observing the IMC interface cross-sectional shape of the intermetallic compound layers 7a and 7b, in addition to an optical microscope observation using an optical microscope photograph through an optical microscope, an SEM observation using an SEM photograph is applicable. The number of scallop shapes can be specified by checking how many scallop shapes are present at an arbitrary side cross-sectional location of the intermetallic compound layers 7a and 7b in the whole width direction of the IMC interface 12 through a visual checking or a predetermined image processing software, and is calculated as a line density based on the whole width dimension of the IMC interface 12 at the side cross-sectional location and the number of specified scallop shapes. It is not necessary that the whole width position where the IMC interface cross-sectional shape of the intermetallic compound layers 7a and 7b is observed is a diameter position of the Cu electrodes 3a and 3b, but such a width position may be shifted from the diameter position. In this embodiment, the Cu electrodes 3a and 3b have a designed value of the electrode diameter that is 150 [μm].

With respect to the average thickness of the intermetallic compound layers 7a and 7b, for example, an image processing software that can extract a particular area of the intermetallic compound layers 7a and 7b in a side cross-sectional location is utilized, and other various techniques are applicable. An example technique is to extract a side cross-sectional region of the intermetallic compound layers 7a and 7b by a visual check based on a side cross-sectional image of the intermetallic compound layers 7a and 7b, such as an optical microscope photograph or an SEM photograph, calculate the area of the extracted region through an image analyzer software, and calculate an average thickness based on the whole width dimension of the IMC interface 12 in the side cross-sectional image and the calculated area. Next, after a thickness value that is 30% of the average thickness is calculated, a boundary line between the Cu electrodes 3a, 3b and the intermetallic compound layers 7a, 7b is identified, and a 30-% average line which is 30% of the average thickness is drawn along the boundary line with reference to this boundary line, thereby identifying a bottom portion deeply concaved under the 30-% average line. Next, it is checked whether or not there is a difference in height that is equal to or greater than 4 [μm] between the bottom portion that is a thin portion lower than the 30-% average line and the peak portion adjacent to the bottom portion, to specify the number of the scallop shapes with a difference in height that is equal to or greater than 4 [μm], and it is determined whether or not a line density is equal to or less than 0.02 [portions/μm] based on the whole width dimension of the observed position of the IMC interface 12.

In the case of FIG. 2A, a side cross-sectional region of the intermetallic compound layer 7a was extracted, an area of the side cross-sectional region was calculated through an image analyzer software (Image J), and an average thickness of the intermetallic compound layer 7a was calculated. As a result, the average thickness was 3.4 [μm] (in the figure, indicated as AVERAGE=3.4 μm), and 30% of the average thickness was 1.02 [μm] (in the figure, indicated as 30-% AVERAGE=1.02 μm). In the intermetallic compound layer 7a, the value of 30% of the average thickness was taken as the 30-% average line and the 30-% average line was drawn with reference to the boundary of the Cu electrode 3a, and the number of the above-explained scallop shapes was visually counted. The result was 0 [portion/μm] (0 portion/129 [μm]), and thus the IMC interface was flattened (a bidirectional arrow is illustrated in the figure as an indication of the length of 4 [μm]).

Moreover, in the case of FIG. 2B, the average thickness of the intermetallic compound layer 7b was calculated. The result was 2.9 [μm] (in the figure, indicated as AVERAGE=2.9 μm), and 30% of the average thickness was 0.87 [μm] (in the figure, indicated as 30-% AVERAGE=0.87 μm). In the case of the intermetallic compound layer 7b, the value of 30% of the average thickness was taken as the 30-% average line, the 30-% average line was drawn with reference to the boundary of the Cu electrode 3b, and the number of the above-explained scallop shapes was counted. The result was 0 [portion/μm] (0 portion/138 [μm]), and thus the IMC interface 12 was flattened.

Figures 3A, 3B:
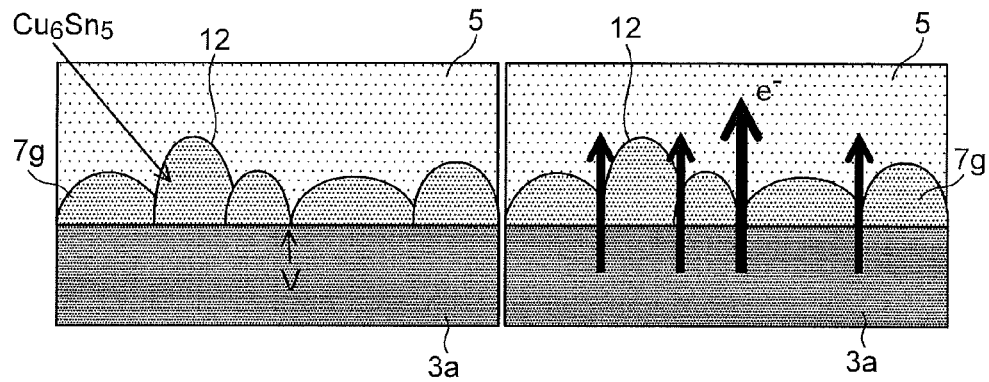
FIG. 3A is a schematic view for a first explanation for a mechanism of an improvement effect of an anti-electromigration characteristic focusing on an IMC interface.
FIG. 3B is a schematic view for a first explanation for a mechanism of an improvement effect of an anti-electromigration characteristic focusing on an IMC interface.

A mechanism of an improvement effect of an anti-electromigration characteristic will be inferred while focusing on the interface shape of the IMC interface 12 in the intermetallic compound layers 7a and 7b. FIG. 3A is an image diagram of an intermetallic compound layer 7g where the number of scallop shapes formed in the IMC interface 12 and having a difference in height that is equal to or larger than 4 [μm] between the bottom portion of thickness portion that is equal to or smaller than 30% of the average thickness and the peak portion adjacent to such a bottom portion is larger than 0.02 [portions/μm]. According to the intermetallic compound layer 7g having the number of such scallop shapes with a large difference in height that is larger than 0.02 [portions/μm] in the IMC interface 12, the IMC interface 12 has a non-uniform thickness by what corresponds to the large number of present scallop shapes having a large difference in height between the peak portion and the bottom portion.

Figures 3C, 3D:
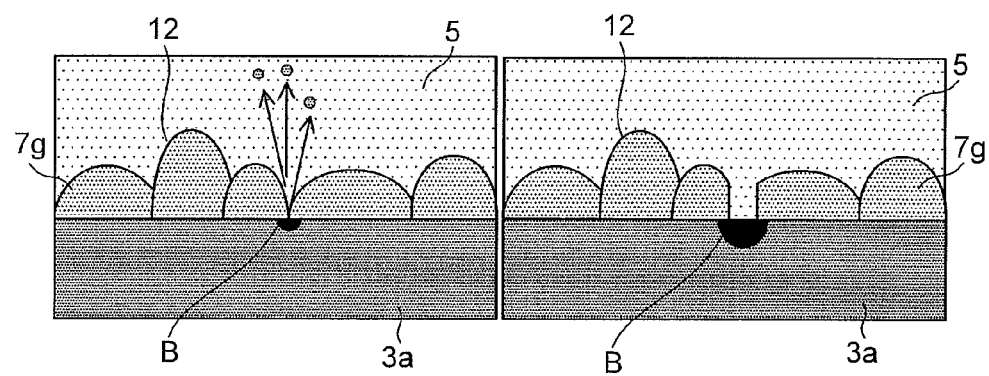
FIG. 3C is a schematic view for a first explanation for a mechanism of an improvement effect of an anti-electromigration characteristic focusing on an IMC interface.
FIG. 3D is a schematic view for a first explanation for a mechanism of an improvement effect of an anti-electromigration characteristic focusing on an IMC interface.
Figure 3E:
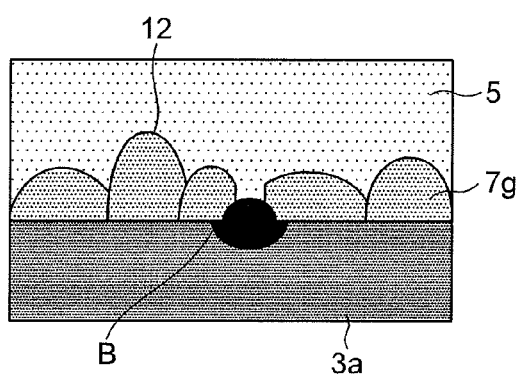
FIG. 3E is a schematic view for a first explanation for a mechanism of an improvement effect of an anti-electromigration characteristic focusing on an IMC interface.

When the primary component of the lead-free solder bump 5 is Sn, the intermetallic compound layer 7g to be formed on the Cu electrode is thin $Cu_3Sn$ layer and $Cu_6Sn_5$ layer. The $Cu_3Sn$ layer formed at the Cu side right after a reflow is thin in comparison with the $Cu_6Sn_5$ layer and thus unillustrated in the figure, but it is presumed that the intermetallic compound layer 7g includes $Cu_3Sn$ and $Cu_6Sn_5$. In this case, $Cu_6Sn_5$ of the intermetallic compound layer 7g has a larger resistance than that of the lead-free solder bump 5 having Sn as a primary component. Accordingly, the resistance of a bottom portion V of a scallop shape largely concaved with a thin thickness becomes lower than those of other portions. Hence, as illustrated in FIG. 3B, in the intermetallic compound layer 7g, currents from the Cu electrode 3a are likely to be concentrated to the bottom portion V of the scallop shape largely concaved. According to the intermetallic compound layer 7g, when currents are concentrated to the bottom portion V of the scallop shape, due to an electromigration, as illustrated in FIG. 3C, diffusion of Cu in the Cu electrode 3a and Cu in the intermetallic compound layer 7g is advanced, as a result, as illustrated in FIG. 3D, Cu is drawn from the peripheral portion of the bottom portion of the IMC interface 12, which enlarges a void. As illustrated in FIG. 3E, in the intermetallic compound layer 7g, the void is further enlarged, and the current density becomes high along with such an enlargement, eventually resulting in a disconnection failure.

Figures 4A, 4B:
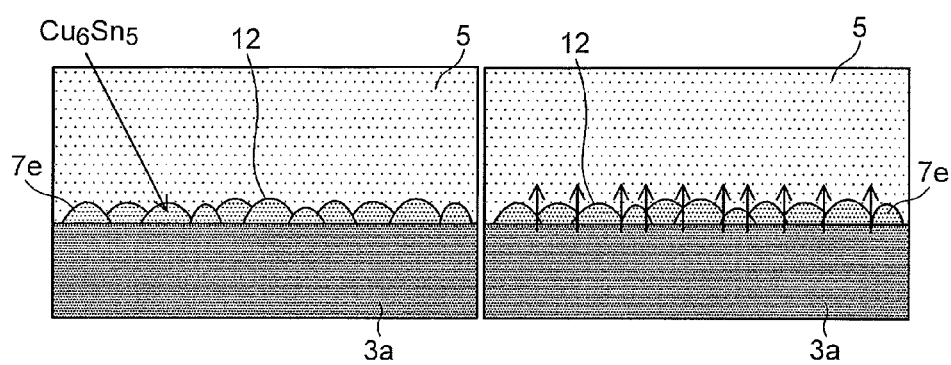
FIG. 4A is a schematic view for a second explanation for a mechanism of an improvement effect of an anti-electromigration characteristic focusing on an IMC interface.
FIG. 4B is a schematic view for a second explanation for a mechanism of an improvement effect of an anti-electromigration characteristic focusing on an IMC interface.

Conversely, as illustrated in FIG. 4A, according to an intermetallic compound layer 7e of this embodiment, the number of scallop shapes having a difference in height that is equal to or larger than 4 [μm] between the bottom portion that is a thickness portion of equal to or smaller than 30% of the average thickness and the peak portion adjacent to the bottom portion is equal to or less than 0.02 [portions/μm] in the IMC interface. Hence, the IMC interface 12 is flattened, and the thickness is uniform. Accordingly, in the case of the intermetallic compound layer 7e, as illustrated in FIG. 4B, currents from the Cu electrode 3a are distributed and a portion where currents are concentrated is eliminated. Hence, a diffusion of Cu in the Cu electrode 3a and Cu in the intermetallic compound layer 7e can be inhibited, and thus an improvement effect of the anti-electromigration characteristic is obtained.

Figure 5A:
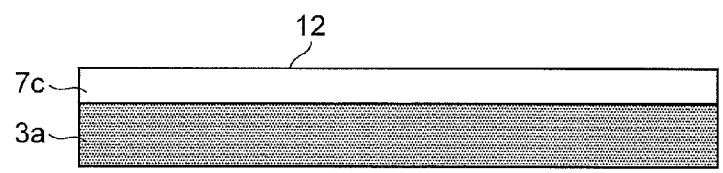
FIG. 5A is a schematic diagram for explaining how to planarize an IMC interface.
Figure 5B:
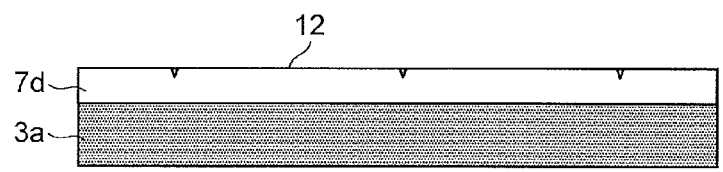
FIG. 5B is a schematic diagram for explaining how to planarize an IMC interface.
Figure 5C:
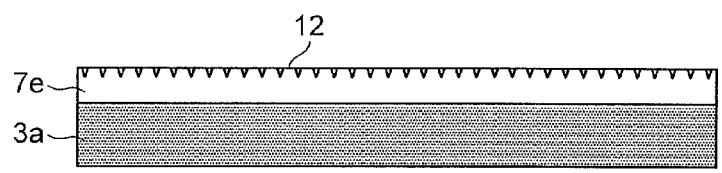
FIG. 5C is a schematic diagram for explaining how to planarize an IMC interface.
Figure 5D:
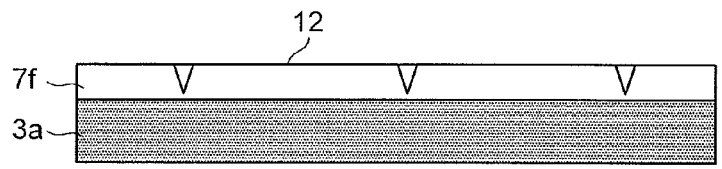
FIG. 5D is a schematic diagram for explaining how to planarize an IMC interface.

In summary, it can be regarded that the IMC interface 12 is flattened in the case of, not only a tabular intermetallic compound layer 7c illustrated in FIG. 5A having no concavity and convexity in the IMC interface 12 but also an intermetallic compound layer 7d having a little number of shallow concavity and convexity where a difference in height is less than 4 [μm] in the IMC interface 12 as illustrated in FIG. 5B, and the intermetallic compound layer 7e having a large number of concavity and convexity in the IMC interface 12 but having a difference in height that is less than 4 [μm] between the bottom portion and the peak portion so that the concavity and convexity is shallow. In those cases, a Cu diffusion around the bottom portion is inhibited, and thus the improvement effect of the anti-electromigration characteristic can be obtained.

Figure 5E:
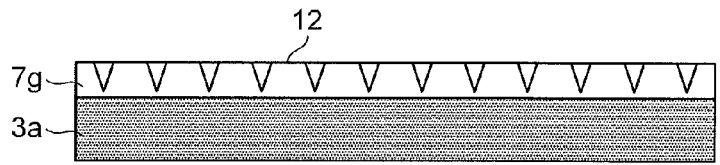
FIG. 5E is a schematic diagram for explaining how to planarize an IMC interface.

Conversely, in the case of, in addition to the intermetallic compound layer 7g having a large number of large scallop shapes with a difference in height that is equal to or larger than 4 [μm] in the IMC interface 12 exceeding 0.02 [portions/μm] illustrated in FIG. 5E, the intermetallic compound layer 7g having a small number of scallop shapes with a difference in height that is equal to or larger than 4 [μm] in the IMC interface 12 but having the number of scallop shapes exceeding 0.02 [portions/μm], it cannot be regarded that the IMC interface 12 is flattened, and thus a Cu diffusion is likely to occur from the periphery of the bottom portion. Accordingly, no improvement effect of the anti-electromigration characteristic is obtainable.

It is preferable that the lead-free solder alloy forming the lead-free solder bump 5 and the intermetallic compound layers 7a and 7b should be an alloy containing Sn as a primary component, and inevitable impurities. In the case of the lead-free solder alloy that is an alloy containing Sn as a primary component and inevitable impurities, also, the IMC interface 12 of the intermetallic compound layers 7a and 7b can be flattened by performing a thermal process (which will be discussed later) for a long time at a temperature lower than the solid-phase temperature of the lead-free solder alloy after the formation of the lead-free solder bump bonding structure, and the improvement effect of the anti-electromigration characteristic can be obtained. Note that the expression Sn as a primary component means that the alloy contains Sn of equal to or greater than 70 mass % with reference to the mass of the whole composition of the lead-free solder alloy.

With respect to the above-explained lead-free solder alloy, in addition to the lead-free solder alloy that is an alloy containing Sn as a primary component and inevitable impurities, solder components, such as Sn—Ag—Cu system, Sn—Ag system, and Sn—Cu system, are also effective, and in this case, it is preferable that such an alloy contains Ag of 0 to 5 mass % and Cu of 0 to 2 mass %. When the Sn—Ag based or Sn—Ag—Cu based lead-free solder alloy contains Ag of 1 to 5 mass %, a network of $Ag_3Sn$ intermetallic compounds are formed in the coagulated constitution, and the strength of the lead-free solder bump and the fatigue characteristic thereof can be improved.

Moreover, according to this embodiment, although a thermal process for a long time at a temperature lower than the solid-phase temperature of the lead-free solder alloy is not performed after the formation of the lead-free solder bump bonding structure, when at least one kind of followings: Ni; Co; and Fe is added to the lead-free solder alloy that is an alloy containing Sn as a primary component and inevitable impurities, the IMC interface 12 of the intermetallic compound layers 7a and 7b can be flattened, and thus the improvement effect of the anti-electromigration characteristic can be obtained. When 3d metal element that is Ni, Co, and Fe is added to the lead-free solder alloy as an additive element, it is desirable that the lead-free solder alloy should contain at least one kind of followings: Ni; Co; and Fe, of 0.005 to 0.2 mass % at total, more preferably, 0.01 to 0.1 mass %. When it is less than 0.005 mass %, an effect of making the IMC interface of the intermetallic compound layer to be flat cannot be obtained. As a result, the improvement effect of the anti-electromigration characteristic cannot be obtained. Conversely, when it exceeds 0.2 mass %, the melting point becomes high, and thus it becomes necessary to revise the reflow condition, which may become a practical disadvantage.

In this case, Ni is likely to be replaced with Cu, and is contained in the intermetallic compound layers 7a and 7b in the form of a substituent with Cu in the intermetallic compound layers 7a and 7b. That is, according to the lead-free solder alloy containing this additive element, the intermetallic compound containing Ni is uniformly, finely and tightly precipitated on the whole surfaces of the Cu electrodes 3a and 3b by the reflow performed on the surfaces of the Cu electrodes 3a and 3b during the manufacturing process, and $Cu_6Sn_5$ is uniformly grown with such an intermetallic compound being as a core. Accordingly, it becomes possible to form the IMC interface 12 having scallop shapes of equal to or less than 0.02 [portions/μm] and made flat. Note that Co and Fe have the same mechanism.

When, for example, the lead-free solder alloy that is an alloy containing Sn as a primary component and inevitable impurities contains Ni of 0.005 to 0.2 mass %, more preferably, 0.01 to 0.1 mass %, Ni and Sn react with each other prior to the reaction of Sn of the lead-free solder alloy and Cu of the Cu electrode 3a by the reflow performed on, for example, the Cu electrode 3a of the first electronic component 2, and $Ni_3Sn_4$ is uniformly and finely precipitated on the whole surface of the Cu electrode 3a at the initial stage of the intermetallic compound layer formation. Subsequently, since $Ni_3Sn_4$ precipitated at the initial stage of the intermetallic compound layer formation is uniform and fine, $Cu_6Sn_5$ with $Ni_3Sn_4$ being as a core also grows uniformly, and thus the intermetallic compound layer 7a made flat and having the scallop shapes of equal to or smaller than 0.02 [portions/μm] can be formed in the IMC interface 12.

The lead-free solder bump bonding structure B11 illustrated in FIG. 1 has the lead-free solder bump 5 and the intermetallic compound layers 7a and 7b formed using a lead-free solder alloy (Sn-1.2Ag-0.5Cu-0.05Ni) that is an alloy containing Sn as a primary component and inevitable impurities, and containing Ag of 1.2 mass %, Cu of 0.5 mass %, and Ni of 0.05 mass %. The IMC interface 12 is flattened without a thermal process for a long time after the formation of the lead-free solder bump bonding structure B11.

The above-explained lead-free solder alloy may contain at least one of following: P; Mg; and Ge as a trace additive element at a total of 0 to 0.01 mass %. When present in Sn, P, Mg, and Ge reduce the oxygen concentration in Sn. When an oxidized inclusion is present near the Cu-electrode interface, the interface characteristic (e.g., the wettability) is extremely deteriorated. According to this embodiment, by adding at least one kind of followings: P; Mg; and Ge, it becomes possible to inhibit a growth of a natural oxidized layer by an oxidized inclusion, and as a result, uniform and fine intermetallic compound is likely to be precipitated on the whole surface of the Cu electrodes 3a and 3b at the initial stage of the intermetallic compound layer formation, and thus the intermetallic compound layers 7a and 7b having the scallop shapes of equal to or smaller than 0.02 [portions/μm] and thus flattened can be formed in the IMC interface 12.

Moreover, the above-explained lead-free solder alloy may contain at least one kind of followings: Pd; Mn; Zn; Al; Sb; and In as an additive element. When the lead-free solder alloy contains at least one kind of followings: Pd; Mn; Zn; Al; Sb; and In, it is preferable that such an alloy should contain Pd, Mn, and Al of 0 to 1 mass %, Sb of 0 to 3 mass %, In of 0 to 7 mass %, and Zn of 0 to 10 mass %. According to this embodiment, when the lead-free solder alloy that is an alloy containing Sn as a primary component and inevitable impurities also contains at least one kind of followings of Pd, Mn, Zn, Al, Sb, and In, the solder itself becomes hard because of solid-solution hardening and precipitation hardening, and thus the temperature cycle characteristic can be improved.

The composition of the above-explained element can be generally set upon measurement through an ICP analyzing technique and GD-MS technique, etc. According to the lead-free solder bump bonding structure B11 of this embodiment, when a lead-free solder alloy in any solder alloy form, such as a flow solder, a reflow solder, or a wire solder, typically utilized in the industries is utilized, the above-explained effects can be accomplished, and when a cream solder including a solder powder, and a solder ball are utilized, the above-explained effects can be also accomplished.

Meanwhile, according to the lead-free solder bump bonding structure B11, the Cu electrode 3a of the first electronic component 2 is formed in a cylindrical shape with a thickness of 40 to 80 [μm], and the Cu electrode 3b of the second electronic component 9 facing with the former Cu electrode is formed in a thin-layer shape with a thickness of 5 to 30 [μm]. However, the Cu electrode 3b of the second electronic component 9 can be formed to have a thickness of equal to or larger than 30 [μm], and in this case, with respect to a Cu diffusion by electromigration, the amount of Cu increases, and thus an effect of extending the breaking time and an effect of easing a current concentration at the bump corner portion bonded with the Cu electrode 3b of the second electronic component 9 can be obtained.

When the lead-free solder bump bonding structure B11 of this embodiment is manufactured, a process of forming the lead-free solder bump 5 on the Cu electrode 3a of the first electronic component 2 and a process of bonding the lead-free solder bump 5 formed on the Cu electrode 3a of the first electronic component 2 with the Cu electrode 3b of the second electronic component 9 are necessary. As an example method for forming the intermetallic compound layers 7a and 7b having the flattened IMC interface 12 with the scallop shapes of equal to or less than 0.02 [portions/μm] having a difference in height that is equal to or greater than 4 [μm], a method of causing at least one of Ni, Co, and Fe to be contained in the lead-free solder alloy and a method of performing a thermal process for a long time at a temperature lower than the solid-phase temperature of the lead-free solder alloy after the formation of the lead-free solder bump bonding structure are possible.

According to the method of making the IMC interface 12 flat by letting the above-explained additive element to be contained in the lead-free solder alloy, at least one of Ni, Co, and Fe is added to the alloy containing Sn as a primary component and inevitable impurities at a total of 0.005 to 0.2 mass %, more preferably, 0.01 to 0.1 mass % under a vacuum condition or in a non-oxidizing atmosphere, etc., the alloy is heated to melt respective component metals, and the alloy is cooled and solidified to produce the lead-free solder alloy. According to a method of manufacturing the lead-free solder bump bonding structure B11 using such a lead-free solder alloy, typically, there are a screen printing technique and a lead-free solder ball technique. According to the screen printing technique, the lead-free solder alloy is transformed into fine solder powders by atomizing, etc., mixed with a flux to form a paste. Squeezing is performed on the Cu electrode 3a using a metal mask to put a certain amount of the paste on the Cu electrode 3a of the first electronic component 2, and first preheating and reflow to be discussed later are performed, thereby forming the lead-free solder bump 5 on the Cu electrode 3a of the first electronic component 2.

Conversely, when the lead-free solder ball is formed from the lead-free solder alloy, a wire cutting technique of drawing and forming a melted lead-free solder alloy ingot in a wire shape, of cutting it into a predetermined length, and of melting it in an oil to form a ball while utilizing the surface tension, an aerial granulation technique of ejecting the melted lead-free solder alloy from a minute orifice vibrating at a certain frequency, of cutting the melted solder at a certain volume by vibration waveforms under a vacuum condition or in a gas atmosphere, and of forming a ball by a surface tension are both applicable. With respect to the manufacturing method using the lead-free solder ball, the above-explained lead-free solder ball is placed on the Cu electrode 3a of the first electronic component 2 to which a flux is applied, and first preheating and reflow are performed to form the lead-free solder bump 5 on the Cu electrode 3a of the first electronic component 2.

Any of the above-explained preheating are, for example, preheating at a temperature of 150 [° C.] for 70 seconds to accomplish the uniformity of the temperature of the whole first electronic component 2 and to diffuse the lead-free solder ions to the surface of the Cu electrode 3a through a flux (in the case of screen printing technique, a flux contained in the paste), thereby forming a reaction layer. The reflow performed after the preheating is to cause the lead-free solder ball or the paste to be melted by heating it at a temperature of equal to or higher than the melting point of the lead-free solder alloy (260 [° C.] for 40 seconds), and to cool and solidify the melted component, thereby forming the lead-free solder bump 5 on the surface of the Cu electrode 3a of the first electronic component 2.

A this time, according to this embodiment, a uniform and fine intermetallic compound is precipitated on the reaction layer of the surface of the Cu electrode 3a by the reflow, $Cu_6Sn_5$ uniformly grows with such an intermetallic compound being as a core, and thus the intermetallic compound layer 7a with the IMC interface 12 having the scallop shapes of equal to or smaller than 0.02 [portions/μm] and thus flattened can be formed. When there is an oxidized layer on the surface of the Cu electrode 3a, the oxidized layer disturbs the reaction between the Cu electrode 3a and the lead-free solder bump 5, and thus the intermetallic compound is not likely to be formed on the surface of the Cu electrode 3a. Hence, in order to form a fine and uniform intermetallic compound on the whole surface of the Cu electrode 3a, it is desirable to eliminate the oxidized layer of the Cu electrode 3a in advance. Since a flux has an effect of eliminating the oxidized layer, it is appropriate if the flux is utilized in the manufacturing process, but in addition, a plasma processing or etching with sulfuric acid, etc., may be applied to eliminate the oxidized layer of the Cu electrodes 3a and 3b.

For example, according to the method of using the lead-free solder ball, when a flux is applied in advance to the surface of the Cu electrode 3a at the time of placing the lead-free solder ball on the surface of the Cu electrode 3a, the oxidized layer can be eliminated at the time of reflow, thereby enabling a formation of the fine and uniform intermetallic compound on the whole surface of the Cu electrode 3a. Likewise, the lead-free solder ball has an oxidized layer, but such an oxidized layer can be eliminated by a flux. Accordingly, a uniform and fine intermetallic compound can be formed on the surface of the Cu electrode 3a without an oxidized layer being present in the interface between the lead-free solder bump 5 and the Cu electrode 3a after the reflow.

Next, the first electronic component 2 having the lead-free solder bump 5 being formed is reversed upside down, the lead-free solder bump 5 is positioned and placed on the Cu electrode 3b of the second electronic component 9 to which a flux is applied, second preheating and reflow are performed under the same condition as explained above to bond the lead-free solder bump 5 on the Cu electrode 3b of the second electronic component 9. Accordingly, the lead-free solder bump bonding structure B11 illustrated in FIG. 1 can be manufactured. That is, according to the lead-free solder bump bonding structure B11, reflow is performed twice at the Cu-electrode-3a side of the first electronic component 2 up to the completion of the manufacturing, an reflow is once performed at the Cu-electrode-3b side of the second electronic component 9.

In the second preheating, likewise, preheating is performed at, for example, 150 [° C.] for 70 seconds to diffuse the lead-free solder ions on the surface of the Cu electrode 3b through a flux, thereby forming a reaction layer. In the second reflow performed after this preheating, heating at a temperature of equal to or higher than the melting point of the lead-free solder alloy is performed to precipitate a uniform and fine intermetallic compound on the reaction layer on the surface of the Cu electrode 3b, and $Cu_6Sn_5$ is uniformly grown with such an intermetallic compound being as a core, thereby forming the intermetallic compound layer 7b of the IMC interface 12 having the scallop shapes of equal to or less than 0.02 [portions/μm] and thus flattened on the surface of the Cu electrode 3b.

Next, an explanation will be given of making the IMC interface flattened by performing a thermal process for a long time after the manufacturing of the lead-free solder bump bonding structure. When a thermal process for a long time is performed after the manufacturing of the lead-free solder bump bonding structure, it is possible to form an intermetallic compound layer having an IMC interface flattened without adding the above-explained additive element of Ni, Co, or Fe to the lead-free solder alloy. For example, a lead-free solder alloy that is an alloy containing Sn as a primary component and inevitable impurities is prepared, and the lead-free solder bump bonding structure is manufactured through the same process explained above.

Figure 6A:
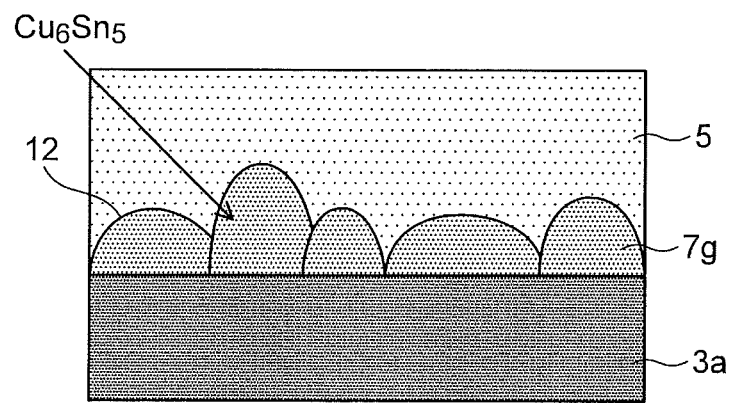
FIG. 6A is a schematic diagram illustrating a first side cross-sectional structure of an intermetallic compound layer before a thermal process.

In this condition, since no additive element is added to the lead-free solder alloy, a uniform and fine intermetallic compound does not precipitate on the surface of the Cu electrode at the time of reflow, and the IMC interface of the intermetallic compound layer formed at the time of reflow is rough. That is, as illustrated in FIG. 6A, the intermetallic compound layer 7g before a thermal process for a long time has the scallop shapes having a difference in height that is equal to or larger than 4 [μm] between the bottom portion of the layer thickness portion equal to or smaller than 30% of the average thickness and the peak portion adjacent to the bottom portion over 0.02 [portions/μm] in the IMC interface 12, and thus the improvement effect of the anti-electromigration characteristic is unobtainable.

Hence, a thermal process for a long time is performed after the lead-free solder bump bonding structure is manufactured. It is preferable that the thermal process for a long time should be carried out at a heating temperature of equal to or higher than 150 [° C.] and equal to or lower than the solid-phase temperature of the lead-free solder alloy for equal to or longer than 70 hours to heat the manufactured lead-free solder bump bonding structure. Note that the solid-phase temperature means a temperature at which the lead-free solder alloy containing predetermined components starts melting at first from the solid phase during a temperature rise.

Figure 6B:
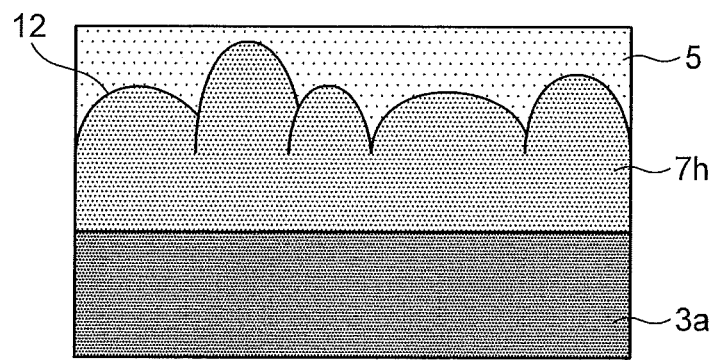
FIG. 6B is a schematic diagram illustrating a first side cross-sectional structure of an intermetallic compound layer after a thermal process.

Hence, the intermetallic compound layer 7g is grown in accordance with the heating time, and as illustrated in FIG. 6B, becomes an intermetallic compound layer 7h with a thick average thickness. Since the average thickness increases, the intermetallic compound layer 7h has the number of bottom portion that is equal to or smaller than 30% of the average thickness reduced, and also has the number of scallop shapes with a difference in height that is equal to or larger than 4 [μm] between the bottom portion and the peak portion adjacent thereto reduced, which is equal to or less than 0.02 [portions/μm], and thus the IMC interface 12 can be flattened. As a result, according to the intermetallic compound layer 7h having undergone the thermal process for a long time, currents from the Cu electrode 3a are distributed and the portions where the currents are concentrated are reduced, and a diffusion of Cu in the intermetallic compound layer 7h can be inhibited. Hence, the improvement effect of the anti-electromigration characteristic can be obtained.

Figure 7A:
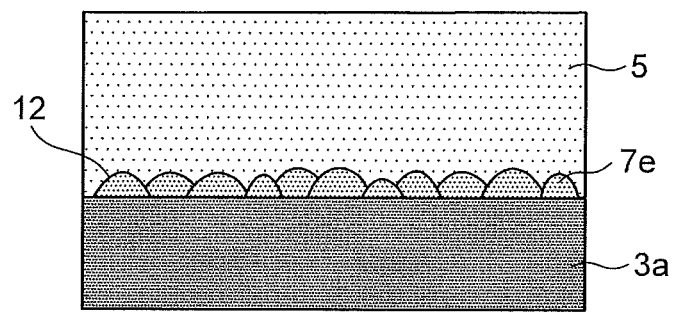
FIG. 7A is a schematic diagram illustrating a second side cross-sectional structure of an intermetallic compound layer before a thermal process.
Figure 7B:
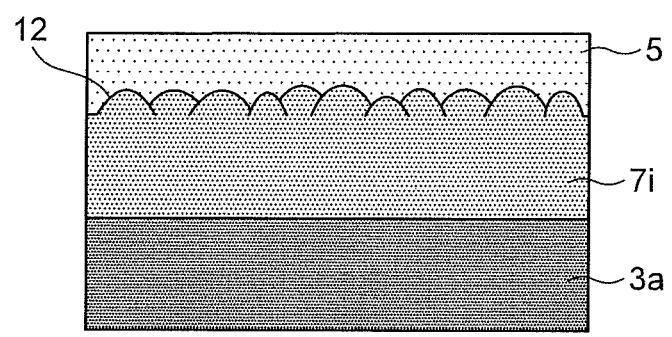
FIG. 7B is a schematic diagram illustrating a second side cross-sectional structure of an intermetallic compound layer after a thermal process.

As illustrated in FIG. 7A, according to the intermetallic compound layer 7e having the IMC interface 12 flattened by adding at least one of Ni, Co, and Fe, also, such an intermetallic compound layer is grown by an application of a thermal process for a long time after the lead-free solder bump bonding structure is manufactured, and as illustrated in FIG. 7B, it becomes a thick intermetallic compound layer 7i. Together with the increase in the thickness, the bottom portions that are equal to or smaller than 30% of the average thickness are reduced, and thus the IMC interface 12 can be further flattened.

In the above-explained structure, according to the lead-free solder bump bonding structure B11 of this embodiment, by reducing the number of scallop shapes in the interface of the intermetallic compound layers 7a and 7b at the lead-free-solder-bump-5 side to be equal to or less than 0.02 [portions/μm] without a formation of an Ni layer in advance as a barrier layer on each surface of each Cu electrode 3a, 3b of the first or second electronic component 2 or 9 unlike the conventional technology, Cu diffusion can be inhibited, thereby inhibiting an occurrence of electromigration. Hence, the burden at the time of manufacturing can be reduced by what corresponds to an elimination of a process of forming an Ni layer as a barrier layer on the surfaces of the Cu electrodes 3a and 3b, and thus the lead-free solder bump bonding structure B11 can be provided which can reduce the burden at the time of manufacturing in comparison with conventional technologies, and which can inhibit an occurrence of an electromigration phenomenon.

Hereinafter, the advantageous effects of the present invention will be explained with reference to specific examples.

Example

Figure 8:
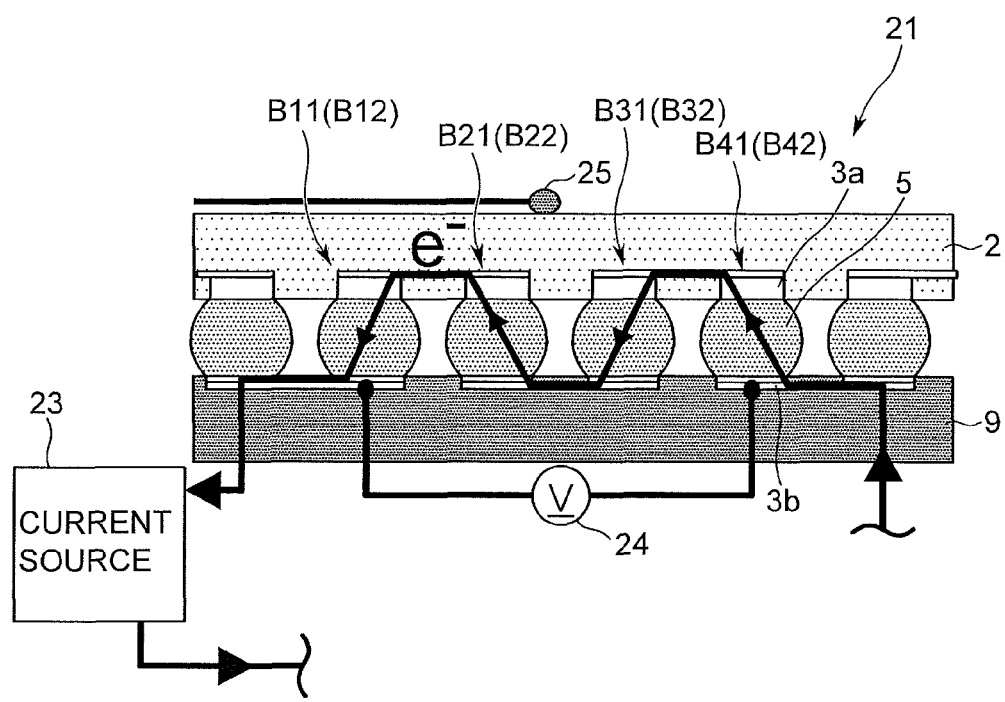
FIG. 8 is a schematic diagram illustrating a whole structure of a test circuit.

An explanation will be below given of examples. In this explanation, as illustrated in FIG. 8, a test circuit 21 electrically connected with eight lead-free solder bump bonding structures B11 to B41, B12 to B42 was prepared, and an interface shape of an IMC interface in the lead-free solder bump bonding structure B11 and the anti-electromigration characteristic of the lead-free solder bump bonding structures B11 to B41 and B12 to B42 were tested. According to the test circuit 21, the Cu electrode 3a of the first electronic component 2 and the Cu electrode 3b of the second electronic component 9 were bonded together by multiple lead-free solder bumps 5 to form a total of eight lead-free solder bump bonding structures B11 to B41, and B12 to B42 that were four by two at a center region. Note that reference numeral 25 in FIG. 8 denotes a thermocouple element.

According to the test circuit 21 of the example 1, a wafer-level package (WLP) cut out from an Si chip was used as the first electronic component 2, while a substrate that was a BT resin (Bismaleimide-Triazine Resin) was used as the second electronic component 9. According to the test circuit 21 of the example 1, first of all, a Sn-1.2Ag-0.5Cu-0.05Ni based lead-free solder alloy was used to form the lead-free solder bump 5 on the Cu electrode 3a of the first electronic component 2 (WLP). In practice, as the first electronic component 2, a WLP including a total of eight cylindrical Cu electrodes 3a each in the size of 150 [μm] φ and arranged in the center region four by two was used, a flux was applied to each Cu electrode 3a without forming an Ni layer as a barrier layer on the surface of each Cu electrode 3a, and a lead-free solder ball that was the above-explained lead-free solder alloy in a ball shape was directly placed on each Cu electrode 3a. The lead-free solder ball was preheated at 150 [° C.] for 70 seconds, and was subjected to reflow at 260 [° C.] for 40 seconds, and thus the lead-free solder bump 5 was formed on the surface of the Cu electrode 3a.

Next, the first electronic component 2 having the lead-free solder bump 5 bonded thereto was reversed upside down, and the lead-free solder bump 5 was directly placed on the Cu electrode 3b of the second electronic component 9 (substrate) to which a flux was applied. The lead-free solder bump 5 was preheated at 150 [° C.] for 70 seconds, and was subjected to reflow at 260 [° C.] for 40 seconds, and thus the lead-free solder bump 5 was bonded to the surface of the Cu electrode 3b. Hence, the test circuit 21 of the example 1 having the eight lead-free solder bump bonding structures B11 to B41 and B12 to B42 at a center region was prepared. Moreover, as the test circuit 21 of the example 2, the test circuit 21 having the first electronic component 2 that was replaced with a substrate from a WLP and causing both substrates bonded together using the same Sn-1.2Ag-0.5Cu-0.05Ni based lead-free solder alloy as the example 1 was prepared under the same condition explained above.

Furthermore, according to the test circuit 21 of comparative example 1, a Sn-3Ag-0.5Cu based lead-free solder alloy to which no Ni was added was used, a WLP and a substrate was bonded under the same condition as explained above, and the test circuit 21 having a difference from the example 1 only in the component of the lead-free solder alloy was prepared. Moreover, as the test circuit 21 of the comparative example 2, a substrate was used instead of the WLP used in the comparative example 1, and both substrates were bonded together under the same condition as explained above using a Sn-3Ag-0.5Cu based lead-free solder alloy to which no Ni was added, and the test circuit 21 was prepared.

With respect to the lead-free solder bump bonding structure of the example 1, an image of a side cross-section at an arbitrary location of the lead-free solder bump was picked up by an SEM, and an SEM photograph illustrated in FIG. 1 was obtained. Moreover, with respect to this side cross-sectional location, an optical microscope photograph was picked up for the intermetallic compound layers 7a and 7b in an enlarged manner, and optical microscope photographs illustrated in FIGS. 2A and 2B were obtained. A side cross-sectional region of each intermetallic compound layer 7a and 7b was visually extracted from such a photograph, the area of such a side cross-sectional region was calculated through an image processing software (Image J), and the average thicknesses of the respective intermetallic compound layers 7a and 7b were calculated, which were 3.4 [μm] and 2.9 [μm].

Next, 30% of the average thicknesses of the intermetallic compound layers 7a and 7b were calculated, which were 1.02 [μm] and 0.87 [μm]. The 30-% thickness value of those average thicknesses were drawn as 30-% average lines with reference to the boundaries of the Cu electrodes 3a and 3b, and the number of scallop (concavo-convex) shapes having a difference in height that was equal to or larger than 4 [μm] between a bottom portion of equal to or smaller than the 30-% average line and peak portion adjacent to the bottom portion was visually counted. In this case, no scallop shape was observed. Hence, it was confirmed that according to the example 1, the line density of the scallop shape in the IMC interface 12 was equal to or less than 0.02 [portions/μm] (0 [portion/μm]), and both IMC interfaces 12 of the intermetallic compound layers 7a and 7b were flattened.

Figure 9:
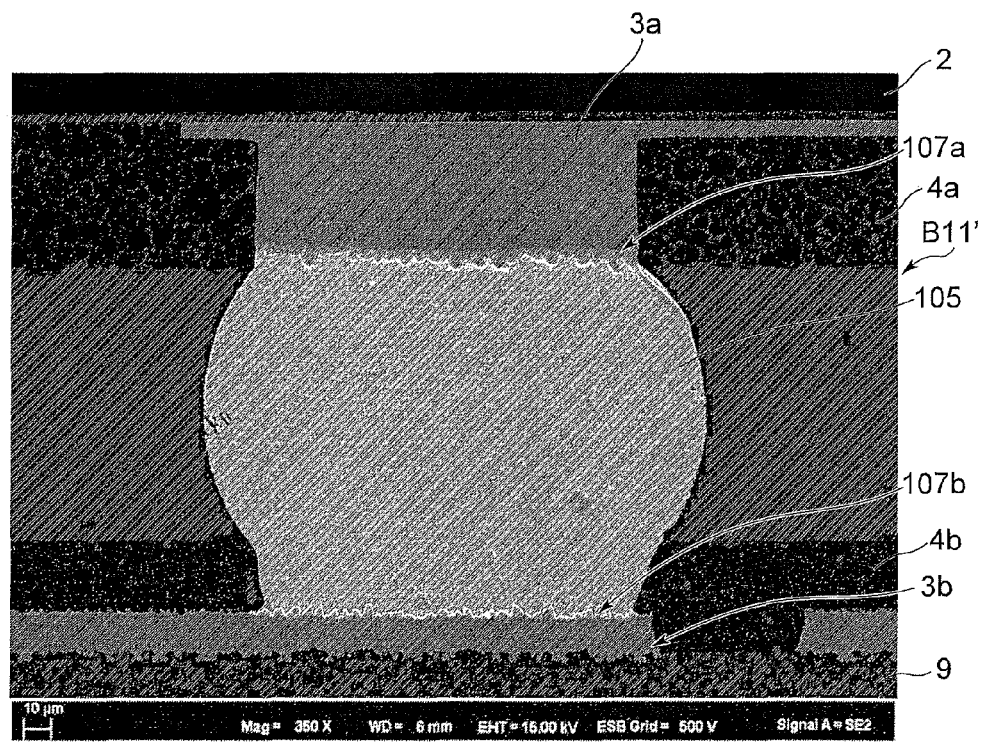
FIG. 9 is an SEM photograph illustrating a side cross-sectional structure of a lead-free solder bump bonding structure according to a comparative example 1.
Figure 9:
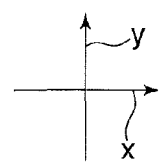

Likewise, with respect to the lead-free solder bump bonding structure of the comparative example 1, an SEM photograph of a side cross-section structure was picked up at an arbitrary location of the lead-free solder bump bonding structure at the first row and the first column, an SEM photograph illustrated in FIG. 9 was obtained. In a lead-free solder bump bonding structure B11' illustrated in FIG. 9, optical microscope photographs of intermetallic compound layers 107a and 107b located at boundary portions between a lead-free solder bump 105 and the Cu electrodes 3a and 3b in an enlarged manner were picked up, and optical microscope photographs illustrated in FIGS. 10A and 10B were obtained.

Figure 10A:
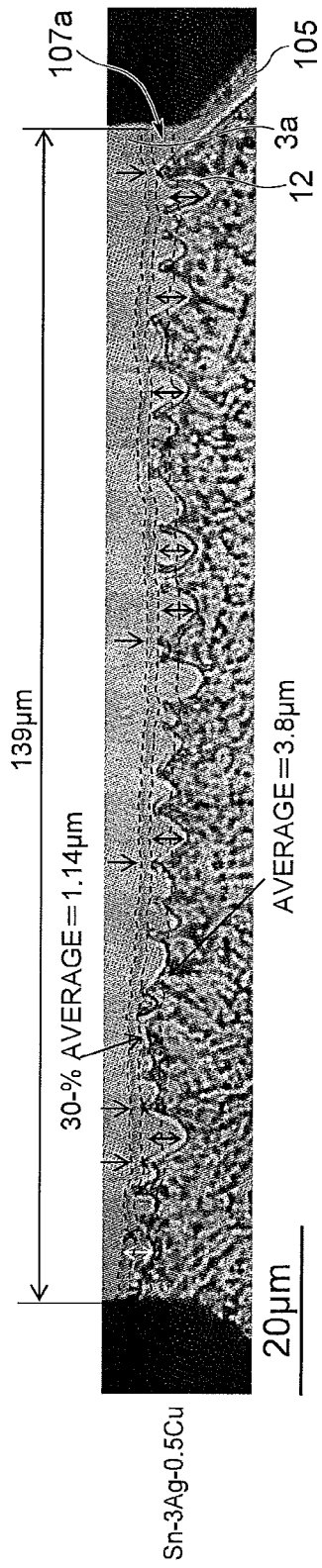
FIG. 10A is an optical microscope photograph illustrating a boundary portion between a lead-free solder bump and a Cu electrode in a lead-free solder bump bonding structure in FIG. 9 in an enlarged manner.

When a side cross-section region of the intermetallic compound layer 107a was extracted from FIG. 10A and the area thereof was calculated through an image analyzer software (Image J) to calculate the average thickness of the intermetallic compound layer 107a, it was 3.8 [μm] (in the figure, indicated as AVERAGE=3.8 μm), and 30% of the average thickness was 1.14 [μm] (in the figure, indicated as 30-% AVERAGE=1.14 μm). In the case of the intermetallic compound layer 107a, the value of 30% of the average thickness was drawn as a 30-% average line with reference to the boundary of the Cu electrode 3a, and the number of scallop shapes having a difference in height that was equal to or larger than 4 [μm] between a bottom portion of equal to or smaller than 30% of the average thickness and a peak portion adjacent to the bottom portion was counted, which was 0.036 [portion/μm] (five portions/139 [μm], in the figure, the scallop shape location is indicated by a downward arrow).

Figure 10B:
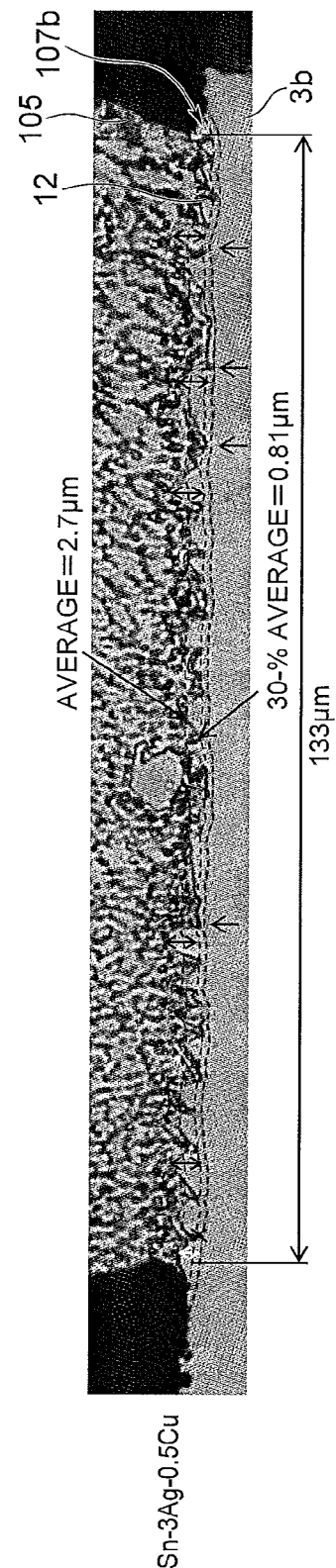
FIG. 10B is an optical microscope photograph illustrating a boundary portion between a lead-free solder bump and a Cu electrode in a lead-free solder bump bonding structure in FIG. 9 in an enlarged manner.

Likewise, with respect to the lower intermetallic compound layer 107b, the average thickness was calculated based on FIG. 10B, which was 2.7 [μm] (in the figure, indicated as AVERAGE=2.7 μm), and 30% of the average thickness was 0.81 [μm] (in the figure, indicated as 30-% AVERAGE=0.81 μm). In the case of the intermetallic compound layer 107b, the value of 30% of the average thickness was drawn as a 30-% average line with reference to the boundary of the Cu electrode 3b, and the number of scallop shapes having a difference in height that was equal to or larger than 4 [μm] between a bottom portion of equal to or smaller than 30% of the average thickness and a peak portion adjacent to the bottom portion was counted, which was 0.030 [portion/μm] (four portions/133 [μm], in the figure, the scallop shape location is indicated by an upward arrow). Hence, in both cases of the intermetallic compound layers 107a and 107b, the number of scallop shapes of the IMC interface 12 exceeded 0.02 [portions/μm], and it was confirmed that the IMC interface 12 was rough.

Next, a verification test for an anti-electromigration characteristic was carried out using the respective test circuits 21 of the example 1, example 2, comparative example 1, and comparative example 2. In the verification test for the anti-electromigration characteristic, currents was caused to flow from the current source 23 through the total of eight lead-free solder bump bonding structures B11 to B41 and B12 to B42 arranged at the center region of the test circuit 21 four by two, and each breaking time until a disconnection failure occurred by an electromigration was measured.

At this time, in each test circuit 21, first of all, currents were sequentially caused to flow through the four lead-free solder bump bonding structures B11 to B41 at the first row in a meandering manner in the vertical direction such as from the lower substrate to the WLP (upper substrate in the cases of example 2 and comparative example 2), and from the WLP (upper substrate in the cases of example 2 and comparative example 2) to the lower substrate. Next, currents were also caused to flow through the four lead-free solder bump bonding structures B12 to B42 at the second row in a meandering manner in the vertical direction such as from the lower substrate to the WLP (upper substrate in the cases of example 2 and comparative example 2) and from the WLP (upper substrate in the cases of example 2 and comparative example 2) to the lower substrate, and the first row and the second row were connected together to cause current to flow therethrough.

Figure 11:
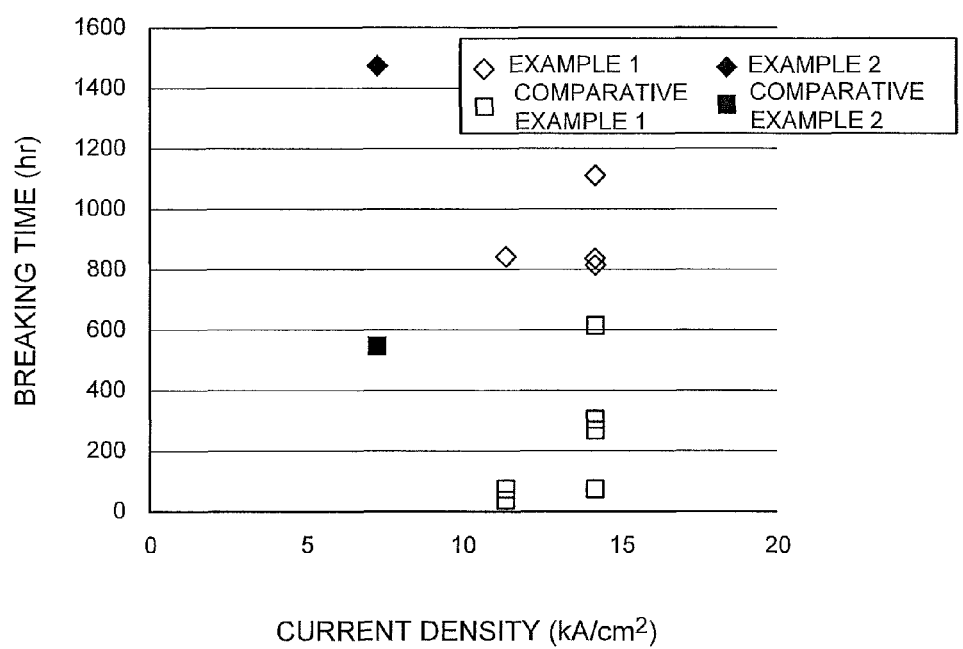
FIG. 11 is a graph illustrating a relationship between a breaking time and a current density.

Next, a voltage value between the lead-free solder bump bonding structures B11 and B41 (B12 and B42) of the first and second rows at terminal ends through which currents were caused to flow was measured by a voltmeter 24 to check a voltage (resistance) change due to an electromigration, and a result illustrated in FIG. 11 was obtained. FIG. 11 has the vertical axis as a normal unit of time, and a horizontal axis as a current density, and is a graph illustrating a relationship between a breaking time and a current density. A white rhomboid indicates the example 1, a black rhomboid indicates the example 2, a white rectangle indicates the comparative example 1, and a black rectangle indicates the comparative example 2.

It becomes clear from FIG. 11 that the example 1 and example 2 which bonded the Cu electrodes 3a and 3b together using the lead-free solder bump 5 that was the lead-free solder alloy to which Ni was added had a longer time until a disconnection failure occurred than the comparative example 1 and comparative example 2 having the lead-free solder alloy to which no Ni was added, and thus the improvement effect of the anti-electromigration characteristic was obtained.

Figure 12A:
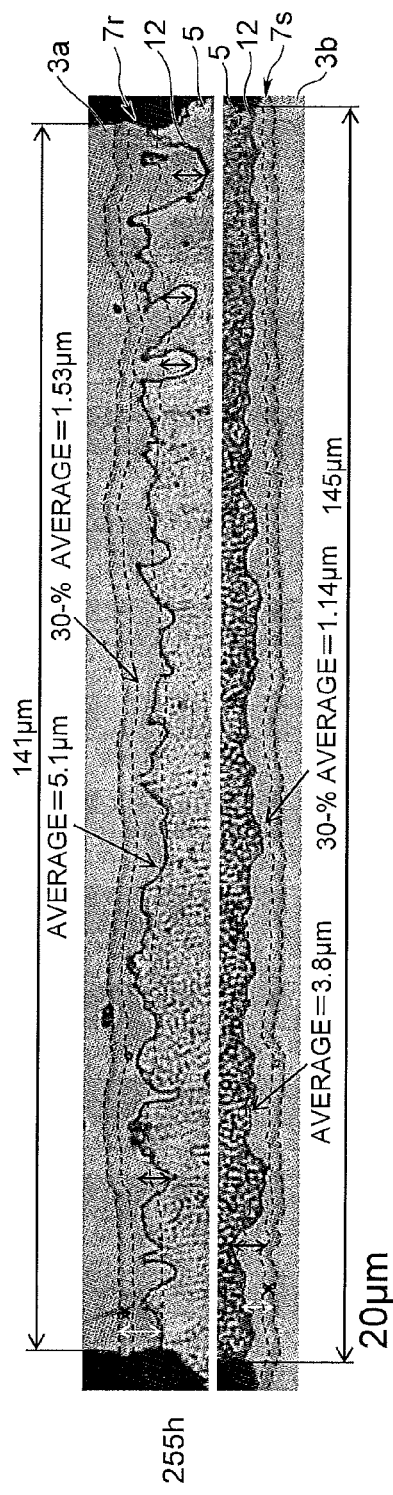
FIG. 12A is an optical microscope photograph illustrating an IMC interface cross-section of an intermetallic compound layer when a thermal process was performed on a lead-free solder bump structure of an example 1 for a predetermined time.

Next, a flattening of the IMC interface by a thermal process after the lead-free solder bump bonding structure was manufactured was tested. In this case, using the test circuits 21 of the example 1 and the comparative example 1, the condition of the IMC interface in the lead-free solder bump bonding structure when the test circuits 21 of the example 1 and the comparative example 1 were further heated at 150 [° C.] for a predetermined time was checked. FIG. 12A is an optical microscope photograph indicating IMC interface cross-sections of intermetallic compound layers 7r and 7s after the lead-free solder bump bonding structure of the example 1 was heated for 255 hours after the manufacturing thereof. Moreover, FIG. 12B is an optical microscope photograph indicating IMC interface cross-sections of intermetallic compound layers 7t and 7u after the lead-free solder bump bonding structure of the example 1 was heated for 1356 hours after the manufacturing thereof.

Based on FIG. 12A, in the case of the upper intermetallic compound layer 7r, the average thickness was 5.1 [µm] (in the figure, indicated as AVERAGE=5.1 µm) and 30% of the average thickness was 1.53 [µm] (in the figure, indicated as 30-% AVERAGE=1.53 µm). Conversely, in the case of the lower intermetallic compound layer 7s, the average thickness was 3.8 [µm] (in the figure, indicated as AVERAGE=3.8 µm), and 30% of the average thickness was 1.14 [µm] (in the figure, indicated as 30-% AVERAGE=1.14 µm). It becomes clear that when a thermal process was performed after the lead-free solder bump bonding structure was manufactured, in comparison with the intermetallic compound layers 7a and 7b (see FIGS. 2A and 2B) prior to the thermal process, the thicknesses thereof increased.

Figure 12B:
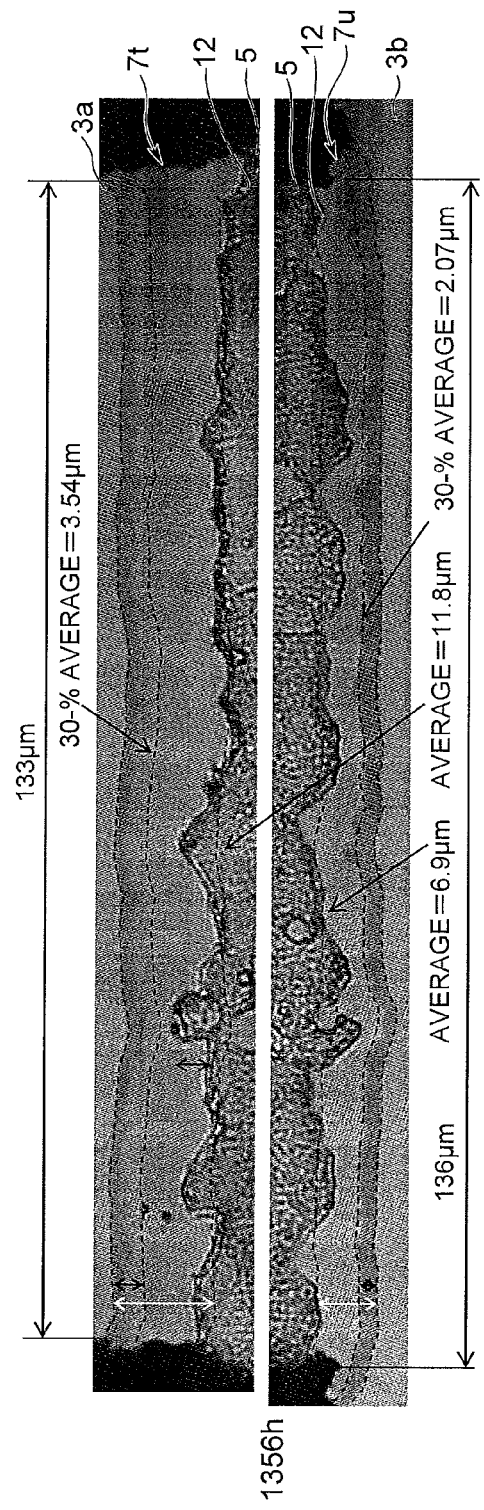
FIG. 12B is an optical microscope photograph illustrating an IMC interface cross-section of an intermetallic compound layer when a thermal process was performed on a lead-free solder bump structure of an example 1 for a predetermined time.

The average thicknesses of the intermetallic compound layers 7t and 7u and 30% of those average thicknesses thereof were calculated from FIG. 12B having the thermal process time further extended, and in the case of the upper intermetallic compound layer 7t, the average thickness was 11.8 [µm] (in the figure, indicated as AVERAGE=11.8 µm), and 30% of the average thickness was 3.54 [µm] (in the figure, indicated as 30-% AVERAGE=3.54 µm). Conversely, in the case of the lower intermetallic compound layer 7u, the average thickness was 6.9 [µm] (in the figure, indicated as AVERAGE=6.9 µm), and 30% of the average thickness was 2.07 [µm] (in the figure, indicated as 30-% AVERAGE=2.07 µm). It becomes clear from those results that when the thermal process time was extended after the manufacturing of the lead-free solder bump bonding structure, the thickness increased in accordance with the thermal process time.

In the cases of the intermetallic compound layers 7r, 7s, 7t, and 7u having undergone a long time thermal process, the number of scallop shapes having a difference in height that was equal to or larger than 4 [µm] between a bottom portion of the layer thickness portion which was equal to or smaller than 30% of the average thickness and a peak portion adjacent to the bottom portion was 0 [portion/µm] (0 portion/141 µm in the case of the intermetallic compound layer 7r at an arbitrary side cross-sectional location, 0 portion/145 µm in the case of the intermetallic compound layer 7s at an arbitrary side cross-sectional location, 0 portion/133 µm in the case of the intermetallic compound layer 7t at an arbitrary side cross-sectional location, and 0 portion/136 µm in the case of the intermetallic compound layer 7u at an arbitrary side cross-sectional location), and thus the number of scallop shapes in the IMC interface 12 was equal to or less than 0.02 [portions/µm].

Figure 13A:
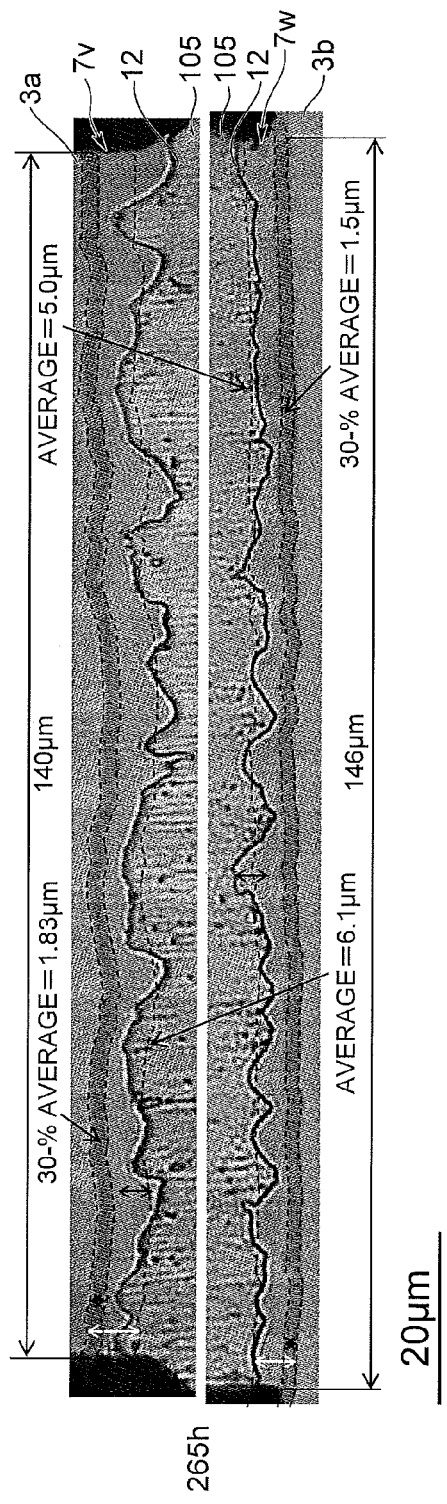
FIG. 13A is an optical microscope photograph illustrating an IMC interface cross-section of an intermetallic compound layer when a thermal process was performed on a lead-free solder bump structure of the comparative example 1 for a predetermined time.

Next, a condition of the IMC interface when a thermal process was performed on the test circuit 21 of the comparative example 1 was checked based on an optical microscope photograph. FIG. 13A is an optical microscope photograph illustrating IMC interface cross-sections of intermetallic compound layers 7v and 7w after the lead-free solder bump bonding structure of the comparative example 1 was heated for 265 hours after the manufacturing thereof. Moreover, FIG. 13B is an optical microscope photograph illustrating IMC interface cross-sections of intermetallic compound layers 7x and 7y after the lead-free solder bump bonding structure of the comparative example 1 was heated for 1118 hours after the manufacturing thereof.

Based on FIG. 13A, in the case of the upper intermetallic compound layer 7v, the average thickness was 6.1 [µm] (in the figure, indicated as AVERAGE=6.1 µm) and 30% of the average thickness was 1.83 [µm] (in the figure, indicates as 30-% AVERAGE=1.83 µm). Conversely, in the case of the lower intermetallic compound layer 7w, the average thickness was 5.0 [µm] (in the figure, indicated as AVERAGE=5.0 µm), and 30% of the average thickness was 1.5 [µm] (in the figure, indicated as 30-% AVERAGE=1.5 µm). It becomes clear that when no Ni was added to the lead-free solder alloy, if a thermal process was performed after the lead-free solder bump bonding structure was manufactured, in comparison with the intermetallic compound layers 107a and 107b (FIGS. 10A and 10B) prior to the thermal process, the thickness increased.

With respect to the intermetallic compound layers 7v and 7w having undergone a long time thermal process, the number of scallop shapes having a difference in height that was equal to or larger than 4 [µm] between a bottom portion which was equal to or smaller than 30% of the average thickness and a peak portion adjacent to the bottom portion was 0 [portion/µm] (0 portion/140 µm in the case of the intermetallic compound layer 7v at an arbitrary side cross-sectional location, and 0 portion/146 µm in the case of the intermetallic compound layer 7w at an arbitrary side cross-sectional location), and thus the number of scallop shapes in the IMC interface 12 was equal to or less than 0.02 [portions/µm] in both cases. Accordingly, it was confirmed that the IMC interface 12 that was rough before a thermal process was flattened by the thermal process.

Figure 13B:
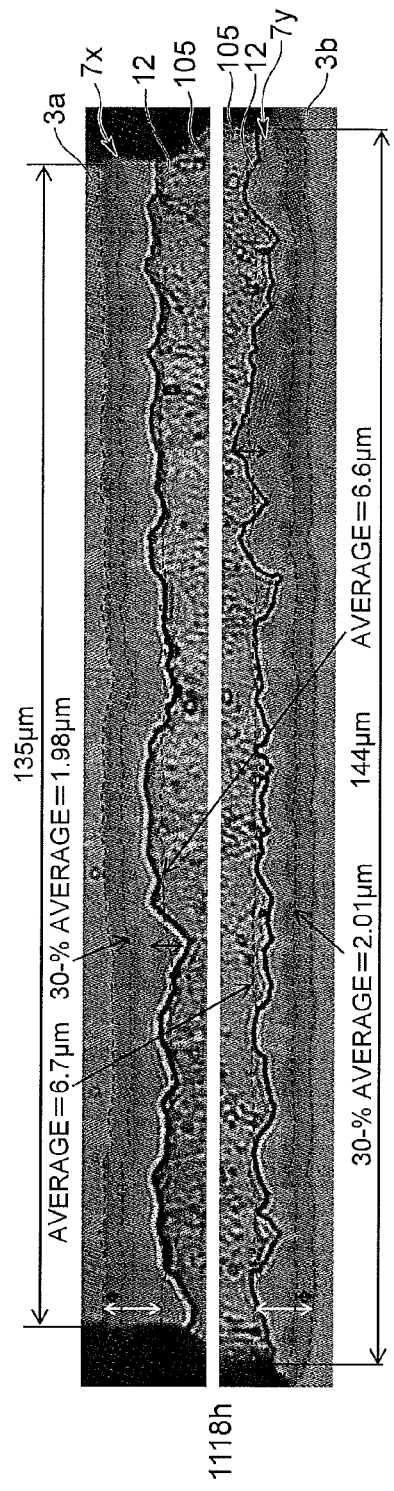
FIG. 13B is an optical microscope photograph illustrating an IMC interface cross-section of an intermetallic compound layer when a thermal process was performed on a lead-free solder bump structure of the comparative example 1 for a predetermined time.

The average thicknesses of the intermetallic compound layers 7x and 7y and 30% of those average thicknesses thereof were calculated from FIG. 13B having the thermal process time further extended, and in the case of the upper intermetallic compound layer 7x, the average thickness was 6.6 [µm] (in the figure, indicated as AVERAGE=6.6 µm), and 30% of the average thickness was 1.98 [µm] (in the figure, indicated as 30-% AVERAGE=1.98 µm). Conversely, in the case of the lower intermetallic compound layer 7y, the average thickness was 6.7 [µm] (in the figure, indicated as AVERAGE=6.7 µm), and 30% of the average thickness was 2.01 [µm] (in the figure, indicated as 30-% AVERAGE=2.01 µm). It becomes clear from those results that when the thermal process time was extended after the manufacturing of the lead-free solder bump bonding structure, the thickness increased in accordance with the thermal process time even in the case of the lead-free solder bump bonding structure using the lead-free solder alloy to which no Ni was added.

With respect to such intermetallic compound layers 7x and 7y, the number of scallop shapes having a difference in height that was equal to or larger than 4 [µm] between a bottom portion which was equal to or smaller than 30% of the average thickness and a peak portion adjacent to the bottom portion was 0 [portion/µm] (0 portion/135 µm in the case of the intermetallic compound layer 7x at an arbitrary side cross-sectional location, and 0 portion/144 μm in the case of the intermetallic compound layer 7y at an arbitrary side cross-sectional location), and thus the number of scallop shapes in the IMC interface 12 was equal to or less than 0.02 [portions/μm] in both cases. Accordingly, it was confirmed that the IMC interface 12 was flattened by the thermal process.

Next, an anti-electromigration characteristic when a thermal process was performed after the lead-free solder bump bonding structure was manufactured to make the IMC interface flattened was tested. In this case, using the test circuit 21 of the example 1 as explained above, this test circuit 21 was heated at 150 [° C.] for 450 hours to cause the intermetallic compound layer at the WLP side to have a thickness of 6 [μm], and thus the test circuit 21 of an example 3 was prepared. Moreover, using the test circuit 21 of the comparative example 1 as explained above, this test circuit 21 was heated at 150 [° C.] for 325 hours to cause the intermetallic compound layer at the WLP side to have a thickness of 6 [μm], and thus the test circuit 21 of an example 4 was prepared.

Figure 14:
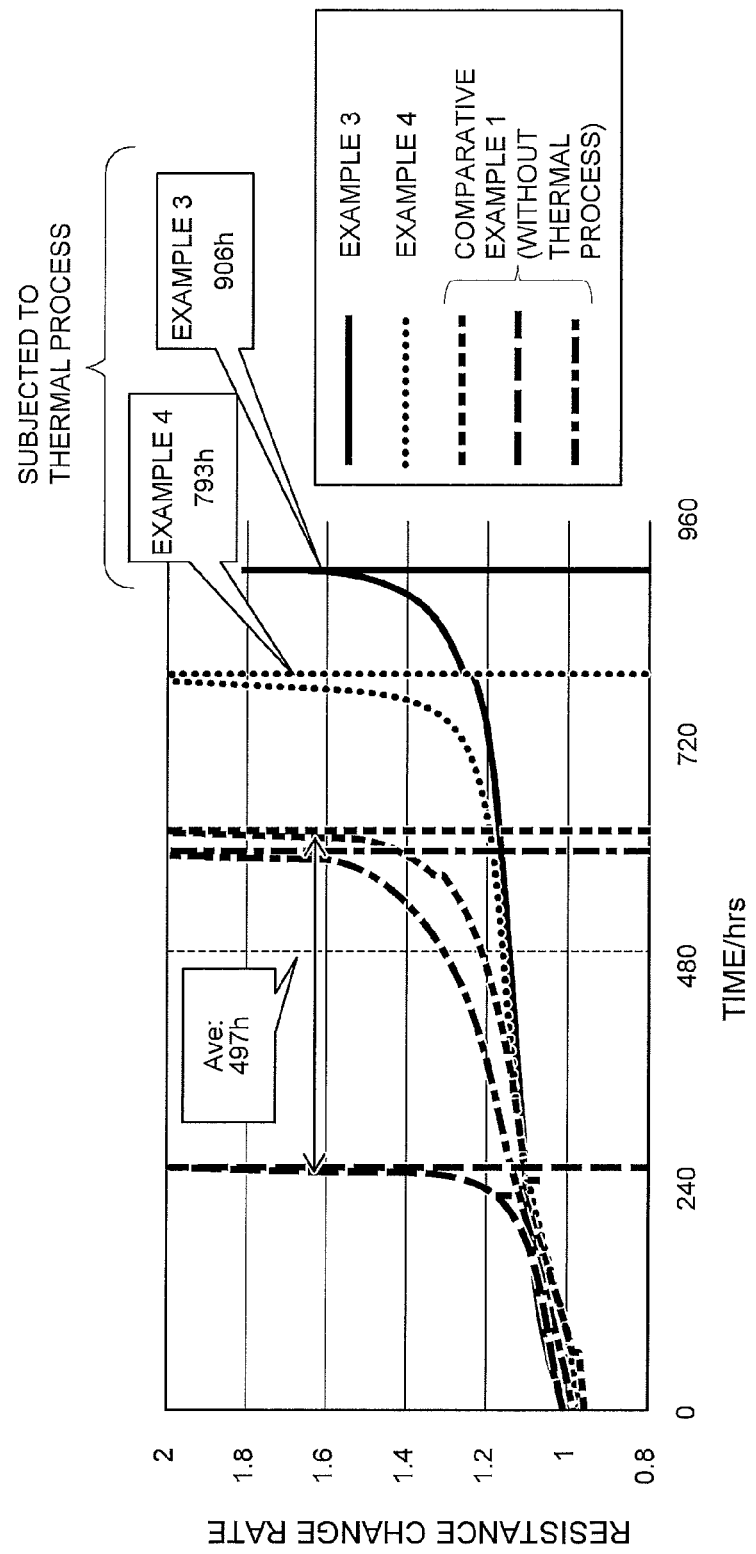
FIG. 14 is a graph illustrating a relationship between a resistance change rate and an elapsed time.

Furthermore, in addition to those circuits, three test circuits 21 of the comparative example 1 were prepared. Next, a current of 2.5 [A] was caused to flow from the current source 23 through the respective test circuits 21 of the example 3, the example 4, and the comparative example 1 (current density: 14.15 [kA/cm²]), and a breaking time until any of the lead-free solder bump bonding structure caused a disconnection failure due to an electromigration was measured. The obtained results are illustrated in FIG. 14. FIG. 14 illustrates a resistance change rate when any of the lead-free solder bump bonding structures in the test circuits 21 caused an electromigration and a disconnection failure occurred. It becomes clear from FIG. 14 that when a resistance change rate sharply increased, a disconnection failure occurred due to an electromigration.

The average time until a disconnection failure occurred in the case of the three test circuits 21 that were the comparative example 1 was 497 hours. Conversely, with respect to both test circuits 21 of the example 3 and the example 4, a time until a disconnection failure occurred was likewise measured. A disconnection failure occurred at 906 hours in the case of the example 3, and a disconnection failure occurred at 793 hours in the case of the example 4. Based on those results, in the case of the test circuit 21 of the example 3, a change in time until a disconnection failure occurred in comparison with the example 1 having undergone no thermal process after the manufacturing was hardly observed. In contrast, in the case of the test circuit 21 of the example 4, in comparison with the comparative example 1 having undergone no thermal process after the manufacturing, it was confirmed that a time until a disconnection failure occurred was remarkably extended, and the obtainment of the improvement effect of the anti-electromigration characteristic due to the thermal process after the manufacturing was confirmed.

Next, a cross-sectional shape of the IMC interface when the added amount of Ni contained in the lead-free solder alloy was changed was tested. In this case, the contained amount of Sn, Ag, and Cu remained the same, but the added amount of Ni only was changed. More specifically, a Sn-1.2Ag-0.5Cu-0.15Ni based lead-free solder alloy containing Ni by 0.15 mass %, a Sn-1.2Ag-0.5Cu-0.10Ni based lead-free solder alloy containing Ni by 0.10 mass %, and a Sn-1.2Ag-0.5Cu based lead-free solder alloy containing no Ni were prepared. Next, through the same manufacturing technique and under the same manufacturing condition as those of the example 1 and the comparative example 1, respective test circuits 21 were prepared.

Next, with respect to a test circuit 21 of an example 5 provided with a lead-free solder bump formed of the Sn-1.2Ag-0.5Cu-0.15Ni based lead-free solder alloy containing Ni by 0.15 mass %, a test circuit 21 of an example 6 provided with a lead-free solder bump formed of the Sn-1.2Ag-0.5Cu-0.10Ni based lead-free solder alloy containing Ni by 0.10 mass %, and the test circuit 21 of the comparative example 2 provided with a lead-free solder bump formed of the Sn-1.2Ag-0.5Cu based lead-free solder alloy containing no Ni, optical microscope photographs of respective IMC interface cross-sections of the lead-free solder bump bonding structures were picked up.

Figure 15A:
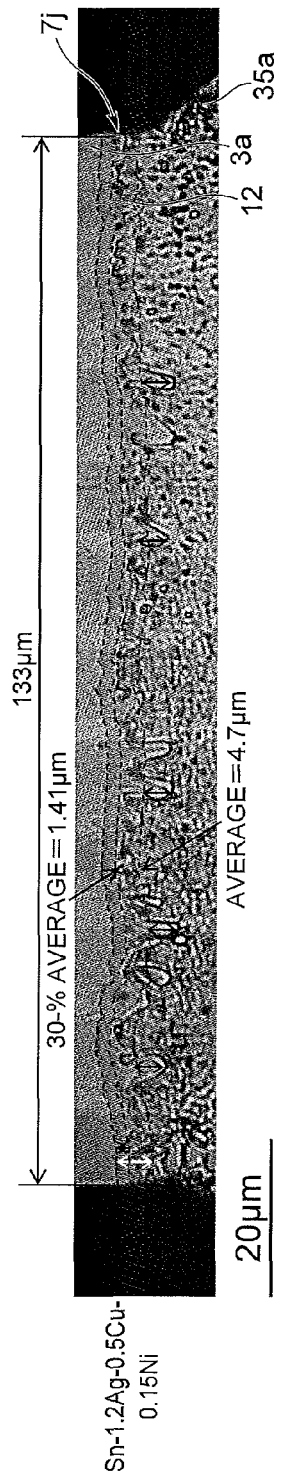
FIG. 15A is an optical microscope photograph of an upper IMC interface in an enlarged manner when the added amount of Ni was changed.
Figure 15B:
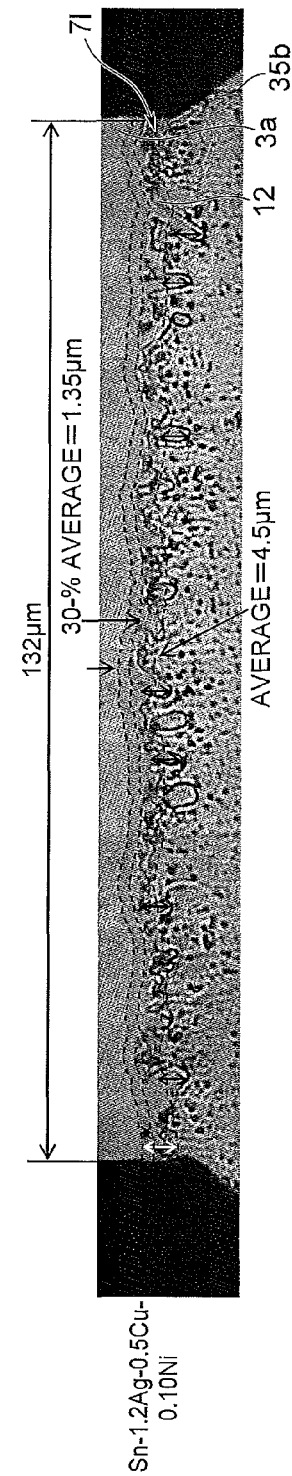
FIG. 15B is an optical microscope photograph of an upper IMC interface in an enlarged manner when the added amount of Ni was changed.
Figure 15C:
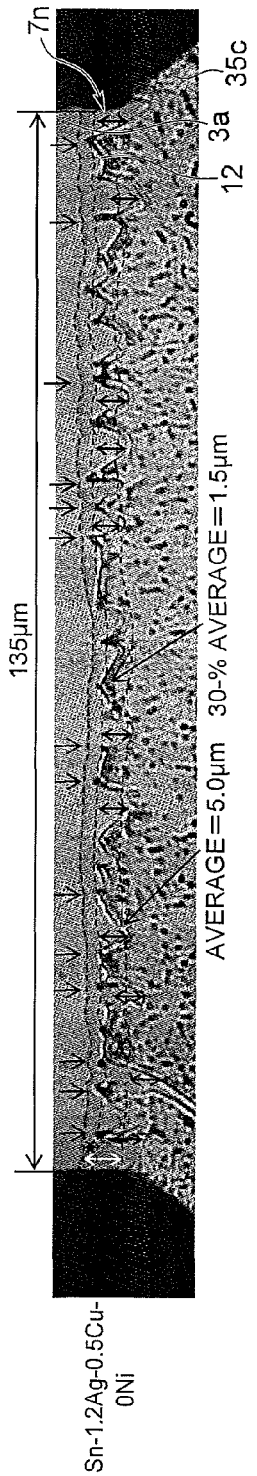
FIG. 15C is an optical microscope photograph of an upper IMC interface in an enlarged manner when the added amount of Ni was changed.
Figure 16A:
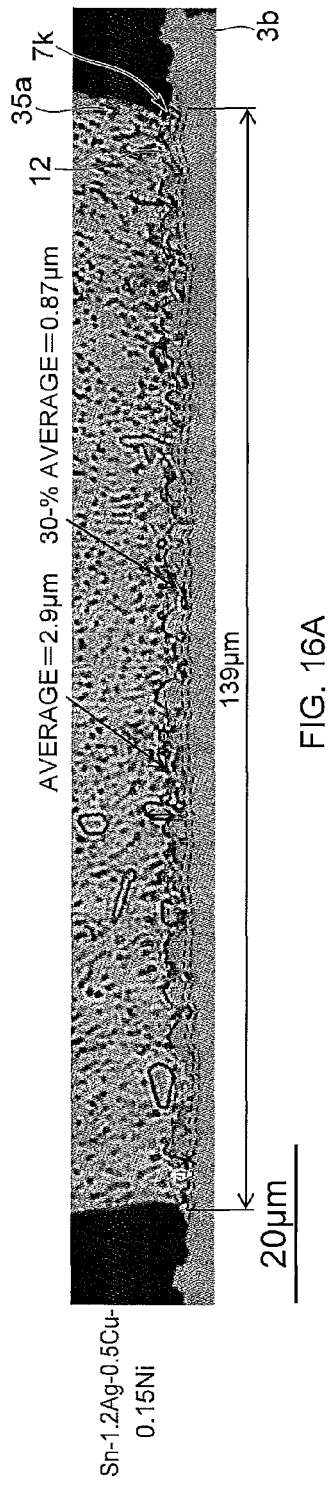
FIG. 16A is an optical microscope photograph of a lower IMC interface in an enlarged manner when the added amount of Ni was changed.
Figure 16B:
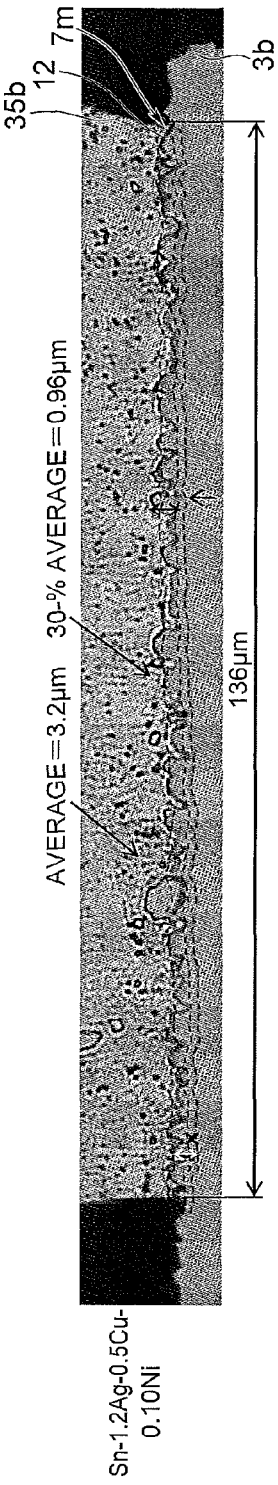
FIG. 16B is an optical microscope photograph of a lower IMC interface in an enlarged manner when the added amount of Ni was changed.
Figure 16C:
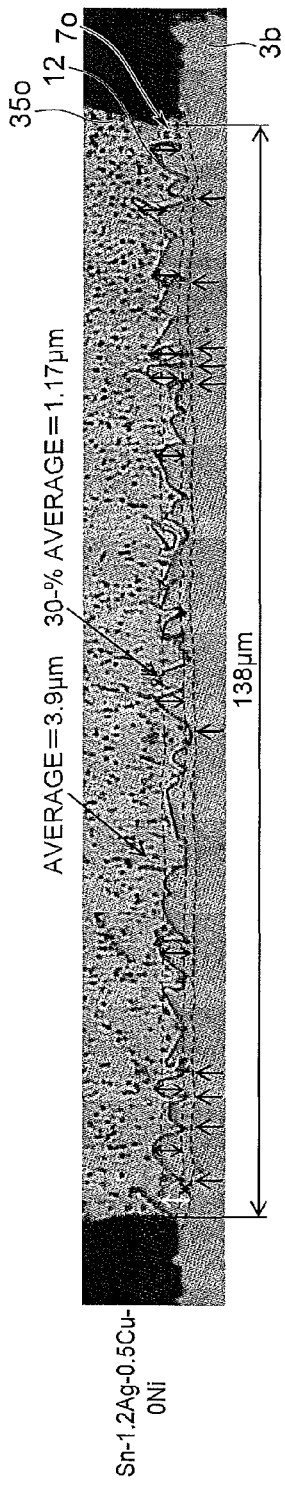
FIG. 16C is an optical microscope photograph of a lower IMC interface in an enlarged manner when the added amount of Ni was changed.

As a result, according to the example 5 using the lead-free solder alloy to which Ni was added by 0.15 mass %, it was confirmed that intermetallic compound layers 7j and 7k illustrated in FIGS. 15A and 16A were formed in a lead-free solder bump 35a along the surfaces of the Cu electrodes 3a and 3b. Moreover, according to the example 6 using the lead-free solder alloy to which Ni was added by 0.10 mass %, it was confirmed that intermetallic compound layers 7l and 7m illustrated in FIGS. 15B and 16B were formed in a lead-free solder bump 35b along the surfaces of the Cu electrodes 3a and 3b. Furthermore, according to the comparative example 2 using the Sn-1.2Ag-0.5Cu based lead-free solder alloy to which no Ni was added, it was confirmed that intermetallic compound layers 7n and 7o illustrated in FIGS. 15C and 16C were formed in a lead-free solder bump 35c along the surfaces of the Cu electrodes 3a and 3b.

In the case of the example 5 to which Ni was added by 0.15 mass %, based on FIG. 15A, the upper intermetallic compound layer 7j had an average thickness of 4.7 [μm] (in the figure, indicated as AVERAGE=4.7 μm), and 30% of the average thickness was 1.41 [μm] (in the figure, indicated as 30-% AVERAGE=1.41 μm). The number of scallop shapes having a difference in height that was equal to or larger than 4 [μm] between a bottom portion which was equal to or smaller than 30% of the average thickness and a peak portion adjacent to the bottom portion was counted, which was 0 [portion/μm] (0 portion/133 μm). Based on FIG. 16A, the lower intermetallic compound layer 7k had an average thickness of 2.9 [μm] (in the figure, indicated as AVERAGE=2.9 μm), and 30% of the average thickness was 0.87 [μm] (in the figure, indicated as 30-% AVERAGE=0.87 μm). The number of scallop shapes having a difference in height that was equal to or larger than 4 [μm] between a bottom portion which was equal to or smaller than 30% of the average thickness and a peak portion adjacent to the bottom portion was counted, which was 0 [portion/μm] (0 portion/139 μm).

As explained above, according to the lead-free solder bump bonding structure of the example 5 using the lead-free solder alloy containing Ni by 0.15 mass %, the number of scallop shapes in the intermetallic compound layers 7j and 7k having a difference in height that was equal to or larger than 4 [μm] between a bottom portion which was equal to or smaller than 30% of the average thickness and a peak portion adjacent to the bottom portion was equal to or less than 0.02 [portions/μm], and thus it was confirmed that the IMC interfaces 12 were flattened in both cases of the intermetallic compound layers 7j and 7k.

In the case of the example 6 to which Ni was added by 0.10 mass %, based on FIG. 15B, the upper intermetallic compound layer 7l had an average thickness of 4.5 [μm] (in the figure, indicated as AVERAGE=4.5 μm), and 30% of the average thickness was 1.35 [μm] (in the figure, indicated as 30-% AVERAGE=1.35 μm). The number of scallop shapes having a difference in height that was equal to or larger than 4 [μm] between a bottom portion which was equal to or smaller than 30% of the average thickness and a peak portion adjacent to the bottom portion was counted, which was 0.0076 [portion/μm] (1 portion/132 μm, the scallop shape location is indicated by a downward arrow in the figure). Based on FIG. 16B, the lower intermetallic compound layer 7m had an average thickness of 3.2 [μm] (in the figure, indicated as AVERAGE=3.2 μm), and 30% of the average thickness was 0.96 [μm] (in the figure, indicated as 30-% AVERAGE=0.96 μm). The number of scallop shapes having a difference in height that was equal to or larger than 4 [μm] between a bottom portion which was equal to or smaller than 30% of the average thickness and a peak portion adjacent to the bottom portion was counted, which was 0.0074 [portion/μm] (1 portion/136 μm, the scallop shape location is indicated by an upward arrow in the figure).

As explained above, according to the lead-free solder bump bonding structure of the example 6 using the lead-free solder alloy containing Ni by 0.10 mass %, the number of scallop shapes in the intermetallic compound layers 7l and 7m having a difference in height that was equal to or larger than 4 [μm] between a bottom portion which was equal to or smaller than 30% of the average thickness and a peak portion adjacent to the bottom portion was equal to or less than 0.02 [portions/μm], i.e., 0.008 [portion/μm] in those cases. Accordingly, it was confirmed that the IMC interfaces 12 were flattened in both cases of the intermetallic compound layers 7l and 7m.

In contrast, in the case of Sn-1.2Ag-0.5Cu based lead-free solder alloy that was the comparative example 2 containing no Ni, based on FIG. 15C, the upper intermetallic compound layer 7n had an average thickness of 5.0 [μm] (in the figure, indicated as AVERAGE=5.0 μm), and 30% of the average thickness was 1.5 [μm] (in the figure, indicated as 30-% AVERAGE=1.5 μm). The number of scallop shapes having a difference in height that was equal to or larger than 4 [μm] between a bottom portion which was equal to or smaller than 30% of the average thickness and a peak portion adjacent to the bottom portion was counted, which was 0.104 [portion/μm] (14 portions/135 μm, the scallop shape location is indicated by a downward arrow in the figure). Moreover, based on FIG. 16C, the lower intermetallic compound layer 7o had an average thickness of 3.9 [μm] (in the figure, indicated as AVERAGE=3.9 μm), and 30% of the average thickness was 1.17 [μm] (in the figure, indicated as 30-% AVERAGE=1.17 μm). The number of scallop shapes having a difference in height that was equal to or larger than 4 [μm] between a bottom portion which was equal to or smaller than 30% of the average thickness and a peak portion adjacent to the bottom portion was counted, which was 0.072 [portion/μm] (10 portions/138 μm, the scallop shape location is indicated by an upward arrow in the figure).

As explained above, according to the lead-free solder bump bonding structure of the comparative example 2 using the lead-free solder alloy to which no Ni was added, the number of scallop shapes in the intermetallic compound layers 7n and 7o having a difference in height that was equal to or larger than 4 [μm] between a bottom portion which was equal to or smaller than 30% of the average thickness and a peak portion adjacent to the bottom portion exceeded 0.02 [portions/μm], and it was confirmed that both IMC interfaces 12 of the intermetallic compound layers 7n and 7o were rough.

The followings are the summary of the above explained points. That is, when the lead-free solder alloy contains Ni by 0.15 mass % or 0.10 mass %, the IMC interfaces 12 of the intermetallic compound layers 7j, 7k, 7l, 7m, 7n, and 7o can be flattened. This results in a inhibition of a Cu diffusion near the bottom portion of the IMC interface 12, and thus the improvement effect of the anti-electromigration characteristic can be obtained.

Figure 17:
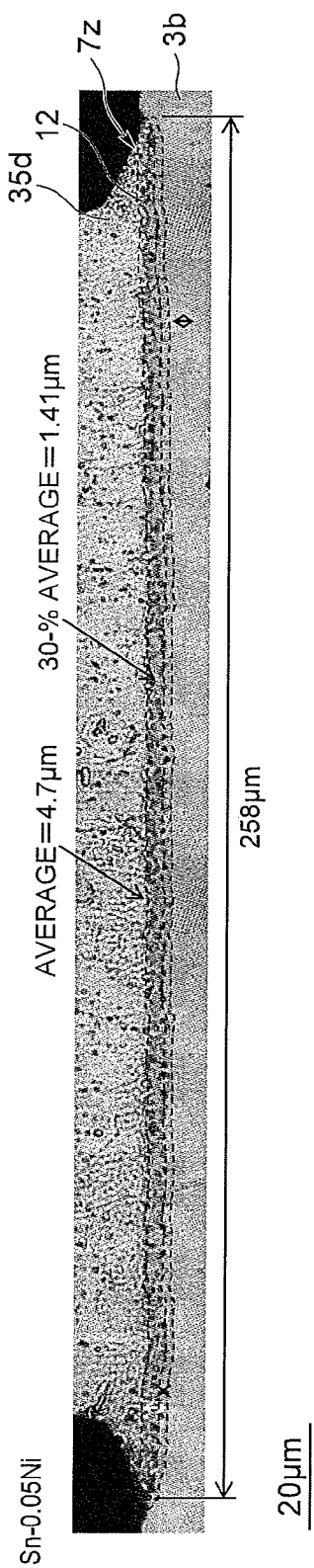
FIG. 17 is an optical microscope photograph of an IMC interface cross-section in a lead-free solder bump structure of an example 7.

Next, with respect to the test circuit 21 of an example 7 using a lead-free solider alloy which contained Sn as a primary component and inevitable impurities and to which Ni of 0.05 mass % was added (Sn-0.05Ni), an optical microscope photograph of the IMC interface cross-section of a lead-free solder bump bonding structure was picked up. FIG. 17 is an optical microscope photograph of the IMC interface cross-section of an intermetallic compound layer 7z formed along the lower Cu electrode 3b in a lead-free solder bump 35d. Based on FIG. 17, in the case of the lower intermetallic compound layer 7z, the average thickness was 4.7 [μm] (in the figure, indicated as AVERAGE=4.7 μm) and 30% of the average thickness was 1.41 [μm] (in the figure, indicates as 30-% AVERAGE=1.41 μm). In this example, the Cu electrode 3b was manufactured with the designed value of the electrode diameter being as 240 [μm], and at the time of manufacturing, the lead-free solder alloy spread like a liquid over the Cu electrode 3b and the flared portion was elongated.

According to the lead-free solder bump bonding structure of this example 7, with respect to a lower intermetallic compound layer 7z having undergone reflow only one time, the number of scallop shapes having a difference in height that was equal to or larger than 4 [μm] between a bottom portion which was equal to or smaller than 30% of the average thickness and a peak portion adjacent to the bottom portion was counted, which was 0 [portion/μm] (0 portion/258 μm). Accordingly, it was confirmed that the number of scallop shapes in the IMC interface 12 was equal to or less than 0.02 [portions/μm] also in the case of this example 7, and the IMC interface 12 was flattened. Based on the above result, when Ni of 0.05 mass % was added to the lead-free solder alloy containing Sn as a primary component but containing no Ag and Cu, the IMC interface 12 of the intermetallic compound layer 7z can be made flat, resulting in a inhibition of a Cu diffusion near the bottom portion of the IMC interface 12. Accordingly, the improvement effect of the anti-electromigration characteristic can be accomplished.

Next, lead-free solder alloys containing components indicated in following tables 1 to 5 were used to bond an WLP and a substrate under the same condition as explained above, and multiple kinds of test circuits 21 having a difference in only the component of the lead-free solder alloy were prepared. Next, like the above-explained cases, the first row and the second row in each test circuit 21 were connected to allow a current to flow therethrough. At this time, a voltage value between the lead-free solder bump bonding structures B11 and B41 (B12 and B42) at terminal ends that were the first row and the second row to which a current was allowed to flow was measured by the voltmeter 24, and a change in the voltage (resistance) due to an electromigration was checked. In any test circuits 21, no thermal process for a long time (additional thermal process) after the manufacturing was performed.

With respect to an EM withstandable characteristic, an evaluation was made through a sample having a bump diameter of 150 [μm] and a current of 2.5 [A] (current density: 14.15 [kA/cm²]). In the fields of EM withstandable characteristic in tables 1 to 5, a case in which a disconnection failure due to an electromigration occurred within 500 hours is indicated by a cross mark, and a case in which such a disconnection failure occurred at a time of equal to or longer than 500 hours but less than 600 hours is indicated by a triangle mark. A case in which such a disconnection failure occurred at a time of equal to or longer than 600 hours but less than 700 hours is indicated by a circle mark, and a case in which such a disconnection failure occurred at a time of equal to or longer than 700 hours but less than 800 hours is indicated by a double circle mark. A case in which such a disconnection failure occurred at a time of equal to or longer than 800 hours but less than 900 hours is indicated by a triple circle mark, and a case in which such a disconnection failure occurred at a time of over 900 hours is indicated by a quadruple circle.

TABLE 1

Sn—Ag—Cu + (Ni, Co, Fe) ✕NO ADDITIONAL THERMAL PROCESS TO ALL CASES

| | Sn | Ag | Cu | Ni | Co | Fe | P | Mg | Ge | Pd | Mn | Al | Sb | In | Zn | WITHSTANDABLE CHARACTERISTIC | TCT CHARACTERISTIC | SURFACE OXIDATION |
|---|---|---|---|---|---|---|---|---|---|---|---|---|---|---|---|---|---|---|
| COMPARATIVE EXAMPLE 3 | 98.300 | 1.2 | 0.50 | 0 | 0 | 0 | 0 | 0 | 0 | 0 | 0 | 0 | 0 | 0 | 0 | x | ○○ | ○ |
| EXAMPLE 8 | 99.995 | 0 | 0 | 0.005 | 0 | 0 | 0 | 0 | 0 | 0 | 0 | 0 | 0 | 0 | 0 | ○ | ○ | ○ |
| EXAMPLE 9 | 99.945 | 0.0 | 0.05 | 0.005 | 0 | 0 | 0 | 0 | 0 | 0 | 0 | 0 | 0 | 0 | 0 | ○ | ○ | ○ |
| EXAMPLE 10 | 98.880 | 1.0 | 0.10 | 0.020 | 0 | 0 | 0 | 0 | 0 | 0 | 0 | 0 | 0 | 0 | 0 | ○○ | ○ | ○ |
| EXAMPLE 1 | 98.250 | 1.2 | 0.50 | 0.050 | 0 | 0 | 0 | 0 | 0 | 0 | 0 | 0 | 0 | 0 | 0 | ○○○○ | ○○ | ○ |
| EXAMPLE 11 | 96.900 | 2.0 | 1.00 | 0.100 | 0 | 0 | 0 | 0 | 0 | 0 | 0 | 0 | 0 | 0 | 0 | ○○ | ○○ | ○ |
| EXAMPLE 12 | 94.850 | 3.0 | 2.00 | 0.150 | 0 | 0 | 0 | 0 | 0 | 0 | 0 | 0 | 0 | 0 | 0 | ○○ | ○○ | ○ |
| EXAMPLE 13 | 94.800 | 5.0 | 0.00 | 0.200 | 0 | 0 | 0 | 0 | 0 | 0 | 0 | 0 | 0 | 0 | 0 | ○ | ○○○ | ○ |
| COMPARATIVE EXAMPLE 4 | 97.050 | 2.0 | 0.70 | 0.250 | 0 | 0 | 0 | 0 | 0 | 0 | 0 | 0 | 0 | 0 | 0 | Δ | ○○ | ○ |
| EXAMPLE 14 | 99.995 | 0 | 0 | 0 | 0.005 | 0 | 0 | 0 | 0 | 0 | 0 | 0 | 0 | 0 | 0 | ○ | ○ | ○ |
| EXAMPLE 15 | 99.945 | 0.0 | 0.05 | 0 | 0.005 | 0 | 0 | 0 | 0 | 0 | 0 | 0 | 0 | 0 | 0 | ○ | ○ | ○ |
| EXAMPLE 16 | 98.880 | 1.0 | 0.10 | 0 | 0.020 | 0 | 0 | 0 | 0 | 0 | 0 | 0 | 0 | 0 | 0 | ○○ | ○ | ○ |
| EXAMPLE 17 | 98.250 | 1.2 | 0.50 | 0 | 0.050 | 0 | 0 | 0 | 0 | 0 | 0 | 0 | 0 | 0 | 0 | ○○○ | ○○ | ○ |
| EXAMPLE 18 | 96.900 | 2.0 | 1.00 | 0 | 0.100 | 0 | 0 | 0 | 0 | 0 | 0 | 0 | 0 | 0 | 0 | ○○ | ○○ | ○ |
| EXAMPLE 19 | 94.850 | 3.0 | 2.00 | 0 | 0.150 | 0 | 0 | 0 | 0 | 0 | 0 | 0 | 0 | 0 | 0 | ○○ | ○○ | ○ |
| EXAMPLE 20 | 94.800 | 5.0 | 0.00 | 0 | 0.200 | 0 | 0 | 0 | 0 | 0 | 0 | 0 | 0 | 0 | 0 | ○ | ○○○ | ○ |
| COMPARATIVE EXAMPLE 5 | 97.050 | 2.0 | 0.70 | 0 | 0.250 | 0 | 0 | 0 | 0 | 0 | 0 | 0 | 0 | 0 | 0 | Δ | ○○ | ○ |
| EXAMPLE 21 | 99.995 | 0 | 0 | 0 | 0 | 0.005 | 0 | 0 | 0 | 0 | 0 | 0 | 0 | 0 | 0 | ○ | ○ | ○ |
| EXAMPLE 22 | 99.945 | 0.0 | 0.05 | 0 | 0 | 0.005 | 0 | 0 | 0 | 0 | 0 | 0 | 0 | 0 | 0 | ○ | ○ | ○ |
| EXAMPLE 23 | 98.880 | 1.0 | 0.10 | 0 | 0 | 0.020 | 0 | 0 | 0 | 0 | 0 | 0 | 0 | 0 | 0 | ○○ | ○ | ○ |
| EXAMPLE 24 | 98.250 | 1.2 | 0.50 | 0 | 0 | 0.050 | 0 | 0 | 0 | 0 | 0 | 0 | 0 | 0 | 0 | ○○○ | ○○ | ○ |
| EXAMPLE 25 | 96.900 | 2.0 | 1.00 | 0 | 0 | 0.100 | 0 | 0 | 0 | 0 | 0 | 0 | 0 | 0 | 0 | ○○ | ○○ | ○ |
| EXAMPLE 26 | 94.850 | 3.0 | 2.00 | 0 | 0 | 0.150 | 0 | 0 | 0 | 0 | 0 | 0 | 0 | 0 | 0 | ○○ | ○○ | ○ |
| EXAMPLE 27 | 94.800 | 5.0 | 0.00 | 0 | 0 | 0.200 | 0 | 0 | 0 | 0 | 0 | 0 | 0 | 0 | 0 | ○ | ○○○ | ○ |
| COMPARATIVE EXAMPLE 6 | 97.050 | 2.0 | 0.70 | 0 | 0 | 0.250 | 0 | 0 | 0 | 0 | 0 | 0 | 0 | 0 | 0 | Δ | ○○ | ○ |

TABLE 2

Sn—Ag—Cu + (P, Mg, Ge) ✕NO ADDITIONAL THERMAL PROCESS TO ALL CASES

| | Sn | Ag | Cu | Ni | Co | Fe | P | Mg | Ge | Pd | Mn | Al | Sb | In | Zn | EM WITHSTANDABLE CHARACTERISTIC | TCT CHARACTERISTIC | SURFACE OXIDATION |
|---|---|---|---|---|---|---|---|---|---|---|---|---|---|---|---|---|---|---|
| EXAMPLE 28 | 98.878 | 1.0 | 0.10 | 0.020 | 0 | 0 | 0.002 | 0 | 0 | 0 | 0 | 0 | 0 | 0 | 0 | ○○ | ○ | ○○ |
| EXAMPLE 29 | 98.245 | 1.2 | 0.50 | 0.050 | 0 | 0 | 0.005 | 0 | 0 | 0 | 0 | 0 | 0 | 0 | 0 | ○○○○ | ○○ | ○○○ |
| EXAMPLE 30 | 96.893 | 2.0 | 1.00 | 0.100 | 0 | 0 | 0.007 | 0 | 0 | 0 | 0 | 0 | 0 | 0 | 0 | ○○ | ○○ | ○○ |
| EXAMPLE 31 | 94.790 | 5.0 | 0.00 | 0.200 | 0 | 0 | 0.010 | 0 | 0 | 0 | 0 | 0 | 0 | 0 | 0 | ○ | ○○○ | ○ |
| COMPARATIVE EXAMPLE 7 | 94.745 | 5.0 | 0.00 | 0.250 | 0 | 0 | 0.005 | 0 | 0 | 0 | 0 | 0 | 0 | 0 | 0 | Δ | ○○○ | ○○○ |
| EXAMPLE 32 | 98.245 | 1.2 | 0.50 | 0 | 0.050 | 0 | 0.005 | 0 | 0 | 0 | 0 | 0 | 0 | 0 | 0 | ○○○ | ○○ | ○○○ |
| EXAMPLE 33 | 98.245 | 1.2 | 0.50 | 0 | 0 | 0.050 | 0.005 | 0 | 0 | 0 | 0 | 0 | 0 | 0 | 0 | ○○○ | ○○○ | ○○○ |
| EXAMPLE 34 | 98.645 | 1.2 | 0.10 | 0.050 | 0 | 0 | 0 | 0.005 | 0 | 0 | 0 | 0 | 0 | 0 | 0 | ○○○ | ○○ | ○○○ |
| EXAMPLE 35 | 92.790 | 5.0 | 2.00 | 0.200 | 0 | 0 | 0 | 0.010 | 0 | 0 | 0 | 0 | 0 | 0 | 0 | ○ | ○○○ | ○ |
| COMPARATIVE EXAMPLE 8 | 92.745 | 5.0 | 2.00 | 0.250 | 0 | 0 | 0 | 0.005 | 0 | 0 | 0 | 0 | 0 | 0 | 0 | Δ | ○○○ | ○○○ |
| EXAMPLE 36 | 98.645 | 1.2 | 0.10 | 0.050 | 0 | 0 | 0 | 0 | 0.005 | 0 | 0 | 0 | 0 | 0 | 0 | ○○○ | ○○ | ○○○ |
| EXAMPLE 37 | 92.790 | 5.0 | 2.00 | 0.200 | 0 | 0 | 0 | 0 | 0.010 | 0 | 0 | 0 | 0 | 0 | 0 | ○ | ○○○ | ○ |
| COMPARATIVE EXAMPLE 9 | 92.745 | 5.0 | 2.00 | 0.250 | 0 | 0 | 0 | 0 | 0.005 | 0 | 0 | 0 | 0 | 0 | 0 | Δ | ○○○ | ○○○ |

TABLE 3

Sn—Ag—Cu + (Pd, Mn, Al) ✗ NO ADDITIONAL THERMAL PROCESS TO ALL CASES

| | Sn | Ag | Cu | Ni | Co | Fe | P | Mg | Ge | Pd | Mn | Al | Sb | In | Zn | EM WITHSTANDABLE CHARACTERISTIC | TCT CHARACTERISTIC | SURFACE OXIDATION |
|---|---|---|---|---|---|---|---|---|---|---|---|---|---|---|---|---|---|---|
| EXAMPLE 38 | 98.780 | 1.0 | 0.10 | 0.020 | 0 | 0 | 0 | 0 | 0 | 0.1 | 0 | 0 | 0 | 0 | 0 | ○○ | ○○ | ○ |
| EXAMPLE 39 | 97.750 | 1.2 | 0.50 | 0.050 | 0 | 0 | 0 | 0 | 0 | 0.5 | 0 | 0 | 0 | 0 | 0 | ○○○○ | ○○ | ○ |
| EXAMPLE 40 | 94.050 | 3.0 | 2.00 | 0.150 | 0 | 0 | 0 | 0 | 0 | 0.8 | 0 | 0 | 0 | 0 | 0 | ○○ | ○○ | ○ |
| EXAMPLE 41 | 93.800 | 5.0 | 0.00 | 0.200 | 0 | 0 | 0 | 0 | 0 | 1.0 | 0 | 0 | 0 | 0 | 0 | ○ | ○○○ | ○ |
| COMPARATIVE EXAMPLE 10 | 94.250 | 5.0 | 0.00 | 0.250 | 0 | 0 | 0 | 0 | 0 | 0.5 | 0 | 0 | 0 | 0 | 0 | Δ | ○○○ | ○ |
| EXAMPLE 42 | 97.750 | 1.2 | 0.50 | 0 | 0.050 | 0 | 0 | 0 | 0 | 0.5 | 0 | 0 | 0 | 0 | 0 | ○○○ | ○○ | ○ |
| EXAMPLE 43 | 97.750 | 1.2 | 0.50 | 0 | 0 | 0.050 | 0 | 0 | 0 | 0.5 | 0 | 0 | 0 | 0 | 0 | ○○○ | ○○ | ○ |
| EXAMPLE 44 | 98.150 | 1.2 | 0.10 | 0.050 | 0 | 0 | 0 | 0 | 0 | 0 | 0.5 | 0 | 0 | 0 | 0 | ○○○ | ○○ | ○ |
| EXAMPLE 45 | 91.800 | 5.0 | 2.00 | 0.200 | 0 | 0 | 0 | 0 | 0 | 0 | 1.0 | 0 | 0 | 0 | 0 | ○ | ○○○ | ○ |
| COMPARATIVE EXAMPLE 11 | 92.250 | 5.0 | 2.00 | 0.250 | 0 | 0 | 0 | 0 | 0 | 0 | 0.5 | 0 | 0 | 0 | 0 | Δ | ○○○ | ○ |
| EXAMPLE 46 | 98.150 | 1.2 | 0.10 | 0.050 | 0 | 0 | 0 | 0 | 0 | 0 | 0 | 0.5 | 0 | 0 | 0 | ○○○ | ○○ | ○ |
| EXAMPLE 47 | 91.800 | 5.0 | 2.00 | 0.200 | 0 | 0 | 0 | 0 | 0 | 0 | 0 | 1.0 | 0 | 0 | 0 | ○ | ○○○ | ○ |
| COMPARATIVE EXAMPLE 12 | 92.250 | 5.0 | 2.00 | 0.250 | 0 | 0 | 0 | 0 | 0 | 0 | 0 | 0.5 | 0 | 0 | 0 | Δ | ○○○ | ○ |

TABLE 4

Sn—Ag—Cu + (Sb, In, Zn) ✗ NO ADDITIONAL THERMAL PROCESS TO ALL CASES

| | Sn | Ag | Cu | Ni | Co | Fe | P | Mg | Ge | Pd | Mn | Al | Sb | In | Zn | WITHSTANDABLE CHARACTERISTIC | TCT CHARACTERISTIC | SURFACE OXIDATION |
|---|---|---|---|---|---|---|---|---|---|---|---|---|---|---|---|---|---|---|
| EXAMPLE 48 | 97.250 | 1.2 | 0.50 | 0.050 | 0 | 0 | 0 | 0 | 0 | 0 | 0 | 0 | 1.0 | 0 | 0 | ○○○○ | ○○ | ○ |
| EXAMPLE 49 | 91.800 | 5.0 | 0.00 | 0.200 | 0 | 0 | 0 | 0 | 0 | 0 | 0 | 0 | 3.0 | 0 | 0 | ○ | ○○○ | ○ |
| COMPARATIVE EXAMPLE 13 | 93.250 | 5.0 | 0.00 | 0.250 | 0 | 0 | 0 | 0 | 0 | 0 | 0 | 0 | 1.5 | 0 | 0 | Δ | ○○○ | ○ |
| EXAMPLE 50 | 97.250 | 1.2 | 0.50 | 0 | 0.050 | 0 | 0 | 0 | 0 | 0 | 0 | 0 | 1.0 | 0 | 0 | ○○○ | ○○ | ○ |
| EXAMPLE 51 | 97.250 | 1.2 | 0.50 | 0 | 0 | 0.050 | 0 | 0 | 0 | 0 | 0 | 0 | 1.0 | 0 | 0 | ○○○ | ○○ | ○ |
| EXAMPLE 52 | 98.830 | 1.0 | 0.05 | 0.020 | 0 | 0 | 0 | 0 | 0 | 0 | 0 | 0 | 0.0 | 0.1 | 0 | ○○ | ○○ | ○ |
| EXAMPLE 53 | 95.650 | 1.2 | 0.10 | 0.050 | 0 | 0 | 0 | 0 | 0 | 0 | 0 | 0 | 0 | 3.0 | 0 | ○○○ | ○○ | ○ |
| EXAMPLE 54 | 85.800 | 5.0 | 2.00 | 0.200 | 0 | 0 | 0 | 0 | 0 | 0 | 0 | 0 | 0 | 7.0 | 0 | ○ | ○○○ | ○ |
| COMPARATIVE EXAMPLE 14 | 89.750 | 5.0 | 2.00 | 0.250 | 0 | 0 | 0 | 0 | 0 | 0 | 0 | 0 | 0 | 3.0 | 0 | Δ | ○○○ | ○ |
| EXAMPLE 55 | 96.250 | 1.2 | 0.50 | 0 | 0.050 | 0 | 0 | 0 | 0 | 0 | 0 | 0 | 0 | 2 | 0 | ○○○ | ○○ | ○ |
| EXAMPLE 56 | 96.250 | 1.2 | 0.50 | 0 | 0 | 0.050 | 0 | 0 | 0 | 0 | 0 | 0 | 0 | 2 | 0 | ○○○ | ○○ | ○ |
| EXAMPLE 57 | 98.430 | 1.0 | 0.05 | 0.020 | 0 | 0 | 0 | 0 | 0 | 0 | 0 | 0 | 0 | 0 | 0.5 | ○○ | ○○ | ○ |
| EXAMPLE 58 | 93.650 | 1.2 | 0.10 | 0.050 | 0 | 0 | 0 | 0 | 0 | 0 | 0 | 0 | 0 | 0 | 5.0 | ○○○ | ○○○ | ○ |
| EXAMPLE 59 | 82.800 | 5.0 | 2.00 | 0.200 | 0 | 0 | 0 | 0 | 0 | 0 | 0 | 0 | 0 | 0 | 10.0 | ○ | ○○○ | ○ |
| COMPARATIVE EXAMPLE 15 | 87.750 | 5.0 | 2.00 | 0.250 | 0 | 0 | 0 | 0 | 0 | 0 | 0 | 0 | 0 | 0 | 5.0 | Δ | ○○○ | ○ |
| EXAMPLE 60 | 98.250 | 1.2 | 0.50 | 0 | 0.050 | 0 | 0 | 0 | 0 | 0 | 0 | 0 | 0 | 0 | 0 | ○○○ | ○○ | ○ |
| EXAMPLE 61 | 98.250 | 1.2 | 0.50 | 0 | 0 | 0.050 | 0 | 0 | 0 | 0 | 0 | 0 | 0 | 0 | 0 | ○○○ | ○○ | ○ |

TABLE 5

✗NO ADDITIONAL THERMAL PROCESS TO ALL CASES

| | Sn | Ag | Cu | Ni | Co | Fe | P | Mg | Ge | Pd | Mn | Al | Sb | In | Zn | EM WITH-STAND-ABLE CHAR-ACTER-ISTIC | TCT CHAR-ACTER-ISTIC | SUR-FACE OXIDA-TION |
|---|---|---|---|---|---|---|---|---|---|---|---|---|---|---|---|---|---|---|
| COMPAR-ATIVE EXAMPLE 16 | 96.795 | 1.2 | 0.50 | 0 | 0 | 0 | 0.003 | 0.001 | 0.001 | 0.3 | 0.1 | 0.10 | 1.0 | 0 | 0 | x | ∘∘ | ∘∘∘ |
| EXAMPLE 62 | 93.745 | 1.2 | 0.50 | 0.050 | 0 | 0 | 0.003 | 0.001 | 0.001 | 0.3 | 0.1 | 0.1 | 2.0 | 1.0 | 1.0 | ∘∘∘∘ | ∘∘∘ | ∘∘∘ |
| COMPAR-ATIVE EXAMPLE 17 | 93.545 | 1.2 | 0.50 | 0.250 | 0 | 0 | 0.003 | 0.001 | 0.001 | 0.3 | 0.1 | 0.1 | 1.0 | 2.0 | 1.0 | Δ | ∘∘ | ∘∘∘ |
| EXAMPLE 63 | 93.745 | 1.2 | 0.50 | 0 | 0.050 | 0 | 0.003 | 0.001 | 0.001 | 0.3 | 0.1 | 0.1 | 2.0 | 1.0 | 1.0 | ∘∘∘ | ∘∘ | ∘∘∘ |
| EXAMPLE 64 | 93.745 | 1.2 | 0.50 | 0 | 0 | 0.050 | 0.003 | 0.001 | 0.001 | 0.3 | 0.1 | 0.1 | 2.0 | 1.0 | 1.0 | ∘∘∘ | ∘∘ | ∘∘∘ |

It was confirmed that when at least one kind of followings: Ni; Co; and Fe was added to alloys containing Sn as a primary component in the above tables 1 to 5 by 0.005 to 0.2 mass %, the EM withstandable characteristic improved. Moreover, in the cases of the Sn—Ag-based material, the Sn—Cu-based material, or an Sn—Ag—Cu-based material, it was confirmed that when at least one kind of Ni, Co, and Fe was added thereto by 0.005 to 0.2 mass %, the EM withstandable characteristic improved. Based on examples 10, 1, and 11 in table 1 and examples 28, 29, and 30 in table 2, it becomes clear that when Ni was added to a lead-free solder alloy by over 0.02 mass % but less than 0.100 mass %, the EM withstandable characteristic was further improved.

Next, an explanation will be given of a test circuit for a TCT (temperature cycle test) characteristic evaluation. A lead-free solder ball with a diameter of 300 [μm] using a solder material of each composition was prepared, a glass-epoxy resin substrate of four [cm] by four [cm] as a substrate was prepared, and a WLP of one [cm] by one [cm] as a chip was prepared. 240 electrodes each having a diameter of 250 [μm] and formed on the substrate and the chip were prepared, and a lead-free solder bump of each kind of solder material was formed on the chip by reflow bonding at first. Next, a test circuit was prepared by flip-chip bonding. The post thickness of the Cu electrode of the WLP, the thickness of the Cu electrode of the substrate, and the reflow condition were the same as those of the example 1. In the test circuit for a TCT characteristic evaluation, a temperature was added to check a TCT characteristic, and results indicated in tables 1 to 5 were obtained.

In the tests for a TCT characteristic in tables 1 to 5, a thermal cycle at a temperature of from −40 to 125 [° C.] (15 minutes for each temperature) was repeatedly applied, and it was checked at which stage the lead-free solder bonding portion (a bonded portion between the WLP and the substrate) caused a breakdown. In the fields of the TCT characteristic in tables 1 to 5, a test piece that did not cause a breakdown in the lead-free solder bonding portion over 500 cycles is indicated by a circle mark. Moreover, a test piece that did not cause a breakdown in the lead-free solder bonding portion over 1000 cycles is indicated by a double circle mark. Furthermore, a test piece that did not cause a breakdown in the lead-free solder bonding portion over 1500 cycles is indicated by a triple circle mark as remarkably excellent. Based on tables 1 to 5, it was confirmed that a TCT characteristic was excellent in any test pieces.

Next, in each test circuit 21, a "surface oxidation" characteristic was checked through checking the oxidized layer thickness of the bump surface after reflow, and results indicated in tables 1 to 5 were obtained. In the fields of surface oxidization in tables 1 to 5, results obtained by evaluating a surface oxidized layer thickness through an Auger analysis are indicated. A case in which the surface oxidized layer thickness was equal to or less than 7 [nm] is indicated by a circle mark, a case equal to or less than 5 [nm] is indicated by a double circle mark, and a case equal to or less than 3 [nm] is indicated by a triple circle mark. Based on tables 1 to 5, it was confirmed that a growth of a surface oxidized layer was inhibited.

What is claimed is:

1. A lead-free solder bump bonding structure comprising:
a lead-free solder bump that bonds a Cu electrode of a first electronic component and a Cu electrode of a second electronic component, a large current with a current density of equal to or greater than $0.7 \times 10^3$ [A/cm$^2$] flowing between the first electronic component and the second electronic component through the lead-free solder bump,
the lead-free solder bump comprising an alloy containing Sn as a primary component and inevitable impurities, and forming intermetallic compound layers in a boundary with the Cu electrode of the first electronic component and in a boundary with the Cu electrode of the second electronic component, and
the intermetallic compound layer having scallop shapes with a difference in height that is equal to or greater than 4 [μm] between a bottom portion which is equal to or smaller than 30% of an average thickness of the intermetallic compound layer, and a peak portion adjacent to the bottom portion, at an interface with the lead-free solder bump, the number of scallop shapes in the intermetallic compound layer being equal to or less than 0.02 [portions/μm].

2. The lead-free solder bump bonding structure according to claim 1, wherein the lead-free solder bump contains at least one kind of followings: Ni; Co; and Fe at a total of 0.005 to 0.2 mass %.

3. The lead-free solder bump bonding structure according to claim 1, wherein the lead-free solder bump contains Ag of 0 to 5 mass % and Cu of 0 to 2 mass %.

4. The lead-free solder bump bonding structure according to claim 1, wherein the lead-free solder bump further contains at least one kind of followings: P; Mg; and Ge at a total of 0 to 0.01 mass %.

5. The lead-free solder bump bonding structure according to claim 1, wherein the lead-free solder bump contains at least one kind of followings: Pd; Mn, Zn; Al; Sb; and In, and, Pd, Mn, and Al being 0 to 1 mass %, Zn being 0 to 10 mass %, Sb being 0 to 3 mass %, and In being 0 to 7 mass %.

* * * * *